(12) United States Patent
Katou et al.

(10) Patent No.: US 7,508,055 B2
(45) Date of Patent: Mar. 24, 2009

(54) HIGH HEAT RELEASE SEMICONDUCTOR AND METHOD FOR MANUFACTURING THE SAME

(75) Inventors: Yutaka Katou, Osaka (JP); Akira Oga, Shiga (JP); Shuichi Ogata, Osaka (JP); Hideki Sakoda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/034,935

(22) Filed: Jan. 14, 2005

(65) Prior Publication Data

US 2005/0253280 A1      Nov. 17, 2005

(30) Foreign Application Priority Data

May 13, 2004   (JP)   ............................. 2004-144149

(51) Int. Cl.
*H01L 23/495*   (2006.01)
(52) U.S. Cl. ...................................... 257/676; 257/692
(58) Field of Classification Search ................. 257/670, 257/676, 690, 695, 666
See application file for complete search history.

(56) References Cited

U.S. PATENT DOCUMENTS

| | | | | |
|---|---|---|---|---|
| 5,457,340 A | * | 10/1995 | Templeton et al. | .......... 257/666 |
| 5,585,670 A | * | 12/1996 | Isshiki et al. | ................. 257/691 |
| 5,606,199 A | * | 2/1997 | Yoshigai | ...................... 257/666 |
| 5,977,619 A | * | 11/1999 | Uemura | ....................... 257/676 |
| 6,798,046 B1 | * | 9/2004 | Miks | ........................... 257/666 |
| 6,806,564 B2 | * | 10/2004 | Terui et al. | ................... 257/691 |
| 6,818,973 B1 | * | 11/2004 | Foster | .......................... 257/676 |
| 2004/0070055 A1 | * | 4/2004 | Punzalan et al. | ............ 257/666 |

FOREIGN PATENT DOCUMENTS

| | | |
|---|---|---|
| JP | 11-168169 | 6/1999 |
| JP | 2000-196006 A | 7/2000 |

* cited by examiner

*Primary Examiner*—Thao X Le
*Assistant Examiner*—Ajay K Arora
(74) *Attorney, Agent, or Firm*—McDermott Will & Emery LLP

(57) ABSTRACT

A semiconductor device includes a die pad of a conductive material, a quadrilateral semiconductor element mounted on the die pad, a plurality of suspension members of the conductive material extending outward from the die pad, a plurality of leads of the conductive material provided between adjacent two of the suspension members and each having a lead end opposed to the semiconductor element, a plurality of thin conductive wires through which the semiconductor element is connected to the leads, respectively, an encapsulant for encapsulating the die pad, the semiconductor element, the suspension members, parts of the leads and the thin conductive wires, and a grounding lead of the conductive material extending from at least one of the suspension members and provided, in part, between one and another of the leads.

23 Claims, 23 Drawing Sheets

FIG. 22
PRIOR ART
FIG. 23
PRIOR ART
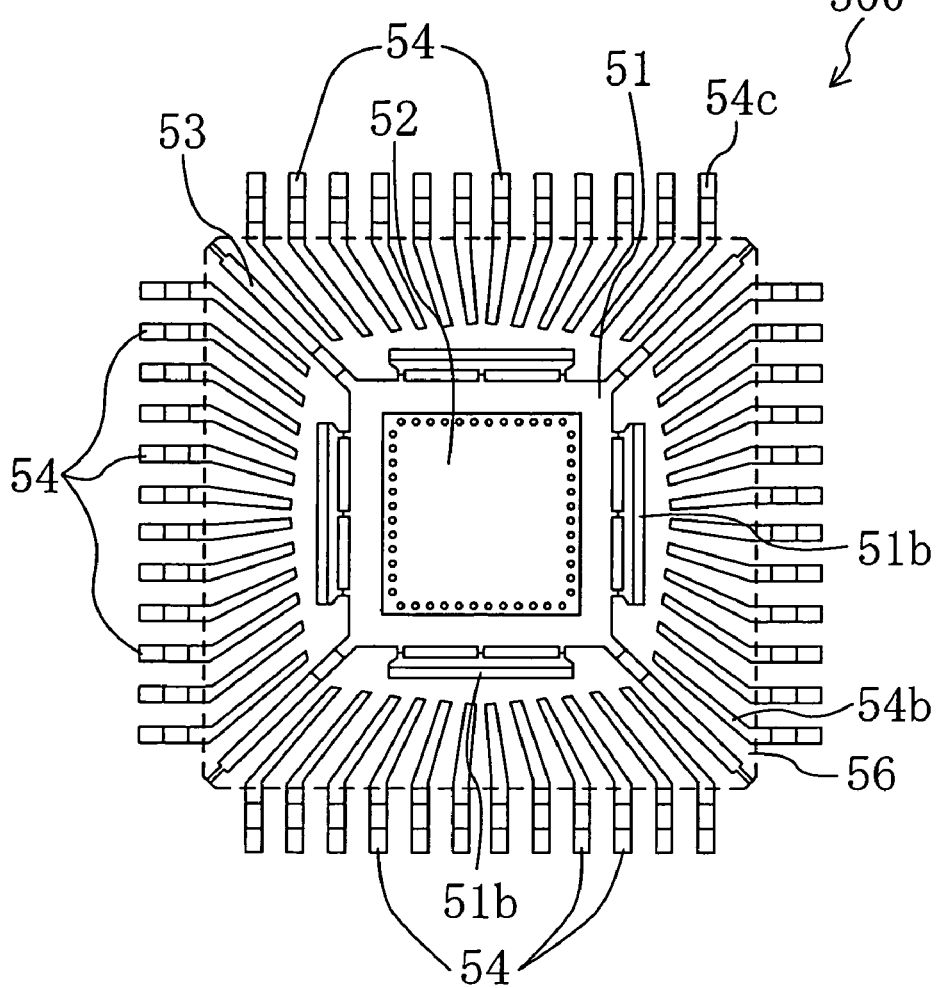
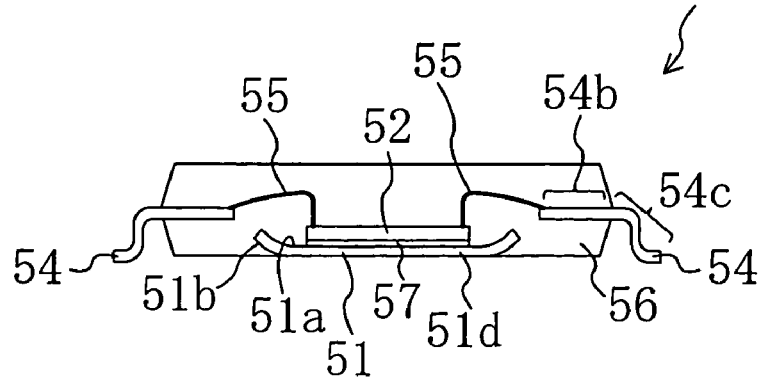

HIGH HEAT RELEASE SEMICONDUCTOR AND METHOD FOR MANUFACTURING THE SAME

CROSS-REFERENCE TO RELATED APPLICATIONS

This application claims priority under 35 U.S.C. §119 on Patent Application No. 2004-144149 filed in Japan on May 13, 2004, the entire contents of which are hereby incorporated by reference.

BACKGROUND OF THE INVENTION (1) Field of the Invention

The present invention relates to a semiconductor device and a method for fabricating the same, and particularly to a semiconductor device adapted to incorporate a semiconductor element having a high heat release value thereinto and a method for fabricating the same.

(2) Description of Related Art

With expansion in functionality and reduction in size and thickness of electronic equipment in recent years, there has been a demand for thinner semiconductor devices. Thus, thin semiconductor devices with excellent heat dissipation ability and moisture-barrier properties have been developed. For example, Japanese Unexamined Patent Publication No. 2000-196006 discloses a semiconductor device having the structure that will be described below.

FIG. 22 is a plan view showing a semiconductor device 500 disclosed in the above publication. FIG. 23 is a cross-sectional view showing the semiconductor device 500 in FIG. 22.

As shown in FIG. 22, the known semiconductor device 500 comprises a die pad 51, a square semiconductor element 52 mounted on the die pad 51, four suspension leads (suspension members) 53, 53, . . . formed continuously with the die pad 51 and extending from the die pad 51 to the outside, a plurality of inner leads 54b, 54b, . . . provided between adjacent two of the suspension leads 53 and each having one end opposed to the corresponding edge of the semiconductor element 52, outer leads 54c, 54c, . . . formed integrally with the respective inner leads 54b and protruding toward the outside, a plurality of thin metal wires (thin conductive wires) 55, 55, . . . through which the semiconductor element 52 is connected to the inner leads 54b, and an encapsulation resin 56 for encapsulating therein the die pad 51, the semiconductor element 52, the suspension leads 53, the inner leads 54b, and the thin metal wires 55. In this relation, the die pad 51, the suspension leads 53, the inner leads 54b, and the outer leads 54c are formed of a conductive material, and the semiconductor element 52 is fixed on the surface 51a of the die pad 51 on which the semiconductor element is mounted (hereinafter, referred to as "semiconductor element mounting surface 51a") by using a conductive adhesive 57. A desired voltage can be applied to the semiconductor element 52 by applying an external voltage to each outer lead 54c, leading to an available semiconductor device.

The die pad 51 has, outside its region on which the semiconductor element 52 is mounted, four wings 51b bent from the four edges of this region, respectively, toward the ends of the inner leads 54b. Therefore, the semiconductor device 500 has excellent moisture-barrier properties. Furthermore, as shown in FIG. 23, the surface 51d of the die pad 51 opposite to the semiconductor element mounting surface 51a (hereinafter, referred to as "exposed surface 51d") is exposed from the encapsulation resin 56. Hence, heat generated in the semiconductor device 500 is dissipated through the exposed surface 51d to the outside. Thus, the semiconductor device 500 has excellent heat dissipation ability. In short, the semiconductor device 500 has excellent heat dissipation ability and moisture-barrier properties.

In order to fabricate such a semiconductor device 500, a conductive plate material is first processed to integrally form the above-described die pad 51, four suspension leads 53, 53, . . . , plurality of inner leads 54b, 54b, . . . , plurality of outer leads 54c, 54c, . . . , and plurality of thin metal wires 55, 55, . . . . The semiconductor element 52 is mounted on the die pad 51 and fixed thereon using the conductive adhesive 57. Then, the semiconductor element 52 is connected through the thin metal wires 55, 55, . . . to the leads 54, respectively. The die pad 51, the semiconductor element 52, the suspension leads 53, the inner leads 54b, and the thin metal wires 55 are encapsulated in the encapsulation resin 56. Thereafter, the outer leads 54c are shaped, thereby fabricating the semiconductor device 500 shown in FIG. 22.

When a semiconductor device is used for a pressure-resistant Plasma Display Panel (PDP) driver, motor driver or the like, the surface of a semiconductor element opposed to a semiconductor element mounting surface (hereinafter, referred to as "to-be-mounted surface of the semiconductor element") must be grounded. The reason for this is that, in some diffusion processes for a semiconductor device, device characteristics vary depending on the potential of a substrate (the to-be-mounted surface of the semiconductor element) and in this case the grounding of the supporting substrate is essential for diffusion processes employed for the above-described drivers. However, the structure of the semiconductor device 500 does not allow the to-be-mounted surface of the semiconductor element to be grounded. This makes it difficult to use the semiconductor device 500 for PDP drivers, motor drivers or the like.

On the other hand, Japanese Unexamined Patent Publication No. 11-168169 discloses the structure of a semiconductor device in which the to-be-mounted surface of a semiconductor element can be grounded. As shown in FIGS. 24 and 25, a semiconductor device 600 disclosed in Japanese Unexamined Patent Publication No. 11-168169 comprises a tub (die pad) 61, a quadrilateral semiconductor chip (semiconductor element) 62 mounted on the tub 61, a plurality of tub suspending leads (suspension members) 63, 63, . . . formed continuously with the tub 61 and extending from the tub 61 to the outside, a plurality of inner leads 64b, 64b, . . . provided between adjacent two of the tub suspending leads 63 and each having one end opposed to the corresponding edge of the semiconductor chip 62, unshown outer leads formed integrally with the inner leads 64b, respectively, and protruding toward the outside, a ground connecting part 68 through which adjacent two of the tub suspending leads 63 are connected to each other and which is located between the semiconductor chip 62 and the end of each inner lead 64b opposed to the corresponding edge of the semiconductor chip 62, a plurality of bonding wires (thin conductive wires) 65, 65, . . . through which surface electrodes 65a located on the semiconductor chip 62 are connected to the inner leads 64b, respectively, and an encapsulant 66 for encapsulating therein the tub 61, the semiconductor chip 62, the tub suspending leads 63, the inner leads 64b, and the bonding wires 65.

The ground connecting part 68 is connected through another bonding wires 65, 65, . . . to the respective surface electrodes 65b, 65b, . . . located on the semiconductor chip 62 and through still another bonding wires 65, 65, . . . to respective inner leads 64b', 64b', . . . for grounding. Thus, the semiconductor chip 62 is electrically connected through the surface electrodes 65b, the bonding wires 65 and the ground connecting part 68 to the inner leads 64b', 64b', ... for grounding. Therefore, the semiconductor chip 62 can be grounded by grounding the inner leads 64b' for grounding.

However, a very small thickness of each bonding wire 65 might cause each bonding wire 65 to be cut during the fabrication of a semiconductor device 600. The semiconductor chip 62 and the ground connecting part 68 are connected through some of the bonding wires 65 to each other, and the ground connecting part 68 and each inner lead 64b' for grounding are connected through one of the bonding wires 65 to each other. The cutting of the bonding wires 65 causes that the semiconductor chip 62 and the inner leads 64b' for grounding are electrically disconnected from each other. As a result, the semiconductor chip 62 cannot be grounded. Therefore, utmost caution must be exercised in fabricating a semiconductor device 600, resulting in the extremely reduced production yield of semiconductor devices 600. Furthermore, new problems are caused. More particularly, since as shown in FIG. 25 the tub 61 is not exposed from the encapsulant 66, the semiconductor device 600 lacks heat dissipation ability. Since as shown in FIG. 25 the tub 61 does not have wings, the semiconductor device 600 lacks moisture-barrier properties.

SUMMARY OF THE INVENTION

It is an object of the present invention to provide a semiconductor device that can be fabricated without deteriorating or losing the grounding function of the semiconductor device during a semiconductor device fabricating process and has excellent heat dissipation ability and moisture-barrier properties and stable quality and a method for fabricating the same.

A semiconductor device of the present invention achieving the above object comprises a die pad of a conductive material, a quadrilateral semiconductor element mounted on the die pad, a plurality of suspension members of the conductive material formed continuously with the die pad and extending outward from the die pad, a plurality of leads of the conductive material provided between adjacent two of the suspension members and each having one end opposed to a corresponding edge of the semiconductor element, a plurality of thin conductive wires through which the corresponding leads are connected to the semiconductor element; and an encapsulant for encapsulating the die pad, the semiconductor element, the suspension members, parts of the leads and the thin conductive wires, the other end of said each lead opposite to said one end thereof protruding from the encapsulant to the outside, wherein the semiconductor device further comprises a grounding lead formed of the conductive material, extending from at least one of the suspension members and aligned, in part, generally parallel with the leads, and a grounding lead parallel part of the grounding lead aligned generally parallel with the leads is located between one and another of the leads.

In this relation, the fact that "a grounding lead parallel part of the grounding lead aligned generally parallel with the leads is located between one and another of the leads" includes the case where one grounding lead is branched to provide a plurality of parts of the grounding lead aligned generally parallel with the leads. Furthermore, this case includes the case where each part of the grounding lead aligned generally parallel with the leads is located between one and another of the leads and the case where the plurality of parts of the grounding lead aligned generally parallel with the leads are located between one and another of the leads.

In the semiconductor device, it is preferable that the die pad and the semiconductor element are electrically connected to each other at a semiconductor element mounting surface of the die pad on which the semiconductor element is mounted.

This means that the semiconductor element mounting surface is electrically connected to the surface of the semiconductor element opposed to the semiconductor element mounting surface.

In the semiconductor device, it is preferable that the semiconductor element mounting surface, the top surface of the grounding lead parallel part, and the top surface of a part of the grounding lead other than the grounding lead parallel part are generally parallel to one another and the top surface of the part of the grounding lead other than the grounding lead parallel part is provided between the semiconductor element mounting surface and the top surface of the grounding lead parallel part.

In the semiconductor device, the part of the grounding lead other than the grounding lead parallel part may comprise a step-like part approaching the semiconductor element mounting surface from the grounding lead parallel part.

In the semiconductor device, the part of the grounding lead other than the grounding lead parallel part is preferably located between the semiconductor element and the ends of some of the leads opposed to the corresponding edge of the semiconductor element.

In the semiconductor device, at least one of the thin conductive wires is preferably provided across the part of the grounding lead other than the grounding lead parallel part.

In the semiconductor device, out of surfaces of the ends of the plurality of leads opposed to the corresponding edges of the semiconductor element, the surfaces thereof generally parallel to the semiconductor element mounting surface are preferably in substantially the same plane that is different from the semiconductor element mounting surface.

In the semiconductor device, the surface of the die pad opposite to the semiconductor element mounting surface is preferably exposed from the encapsulant.

In the semiconductor device, it is preferable that the die pad comprises at least one extension extending outward from a region of the die pad on which the semiconductor element is mounted and at least one part of the extension is bent toward the leads from the region of the die pad on which the semiconductor element is mounted.

In the semiconductor device, the surface of the die pad opposite to the semiconductor element mounting surface preferably comprises an indentation around its periphery.

A method for fabricating a semiconductor device of the present invention achieving the above object comprises the steps of: processing a conductive plate material to integrally form a die pad on which a quadrilateral semiconductor element is to be mounted, a plurality of suspension members formed continuously with the die pad and extending outward from the die pad, a plurality of leads provided between adjacent two of the suspension members and each having one end opposed to a corresponding edges of the semiconductor element, and a grounding lead extending from at least one of the suspension members and aligned, in part, generally parallel with the leads; mounting the semiconductor element on the die pad; connecting the semiconductor element through thin conductive wires to the leads, respectively; and encapsulating the die pad, the semiconductor element, the suspension members, parts of the leads, the grounding lead, and the thin conductive wires using an encapsulant, wherein a grounding lead parallel part of the grounding lead aligned generally parallel with the leads is located between one and another of the leads.

In this relation, the fact that "a grounding lead parallel part of the grounding lead aligned generally parallel with the leads is located between one and another of the leads" includes the case where one grounding lead is branched to provide a plurality of parts of the grounding lead aligned generally parallel with the leads. Furthermore, this case includes the case where each part of the grounding lead aligned generally parallel with the leads is formed between one and another of the leads and the case where the plurality of parts of the grounding lead aligned generally parallel with the leads are formed between one and another of the leads.

According to the method for fabricating a semiconductor device, in the step of mounting the semiconductor element on the die pad, it is preferable that the die pad is electrically connected to the semiconductor element at a semiconductor element mounting surface of the die pad on which the semiconductor element is mounted.

This means that the semiconductor element mounting surface is electrically connected to the surface of the semiconductor element opposed to the semiconductor element mounting surface.

According to the method for fabricating a semiconductor device, it is preferable that, in the step of processing the conductive plate material, a semiconductor element mounting surface of the die pad on which the semiconductor element is mounted, the top surface of the grounding lead parallel part, and the top surface of a part of the grounding lead other than the grounding lead parallel part are provided generally parallel to one another and the top surface of the part of the grounding lead other than the grounding lead parallel part is provided between the semiconductor element mounting surface and the top surface of the grounding lead parallel part.

According to the method for fabricating a semiconductor device, in the step of processing the conductive plate material, the part of the grounding lead other than the grounding lead parallel part may be provided with a step-like part approaching the semiconductor element mounting surface from the grounding lead parallel part.

According to the method for fabricating a semiconductor device, in the step of processing the conductive plate material, the part of the grounding lead other than the grounding lead parallel part is preferably located between the semiconductor element and the ends of some of the leads opposed to the corresponding edge of the semiconductor element.

According to the method for fabricating a semiconductor device, in the step of connecting the semiconductor element through thin conductive wires to the leads, respectively, at least one of the thin conductive wires is preferably provided across the part of the grounding lead other than the grounding lead parallel part.

According to the method for fabricating a semiconductor device, in the step of processing the conductive plate material, out of surfaces of parts of the conductive plate material that will be the ends of the plurality of leads opposed to the corresponding edges of the semiconductor element, the surfaces thereof generally parallel to the semiconductor element mounting surface are preferably formed to be in substantially the same plane that is different from the semiconductor element mounting surface.

According to the method for fabricating a semiconductor device, in the encapsulating-step using the encapsulant, the surface of the die pad opposite to the semiconductor element mounting surface is preferably exposed from the encapsulant.

According to the method for fabricating a semiconductor device, in the step of processing the conductive plate material, it is preferable that the die pad is formed to have at least one extension extending outward from a region of the die pad on which the semiconductor element is to be mounted and at least one part of the extension is bent toward the leads from the region of the die pad on which the semiconductor element is mounted.

According to the method for fabricating a semiconductor device, the step of processing the conductive plate material preferably comprises the step of providing an indentation around the periphery of the surface of the die pad opposite to the semiconductor element mounting surface.

BRIEF DESCRIPTION OF THE DRAWINGS

FIG. 22 is a plan view showing a semiconductor device 500 of a known example.

FIG. 23 is a cross-sectional view showing the semiconductor device 500 of the known example.

DETAILED DESCRIPTION OF THE INVENTION

Figure 1A:
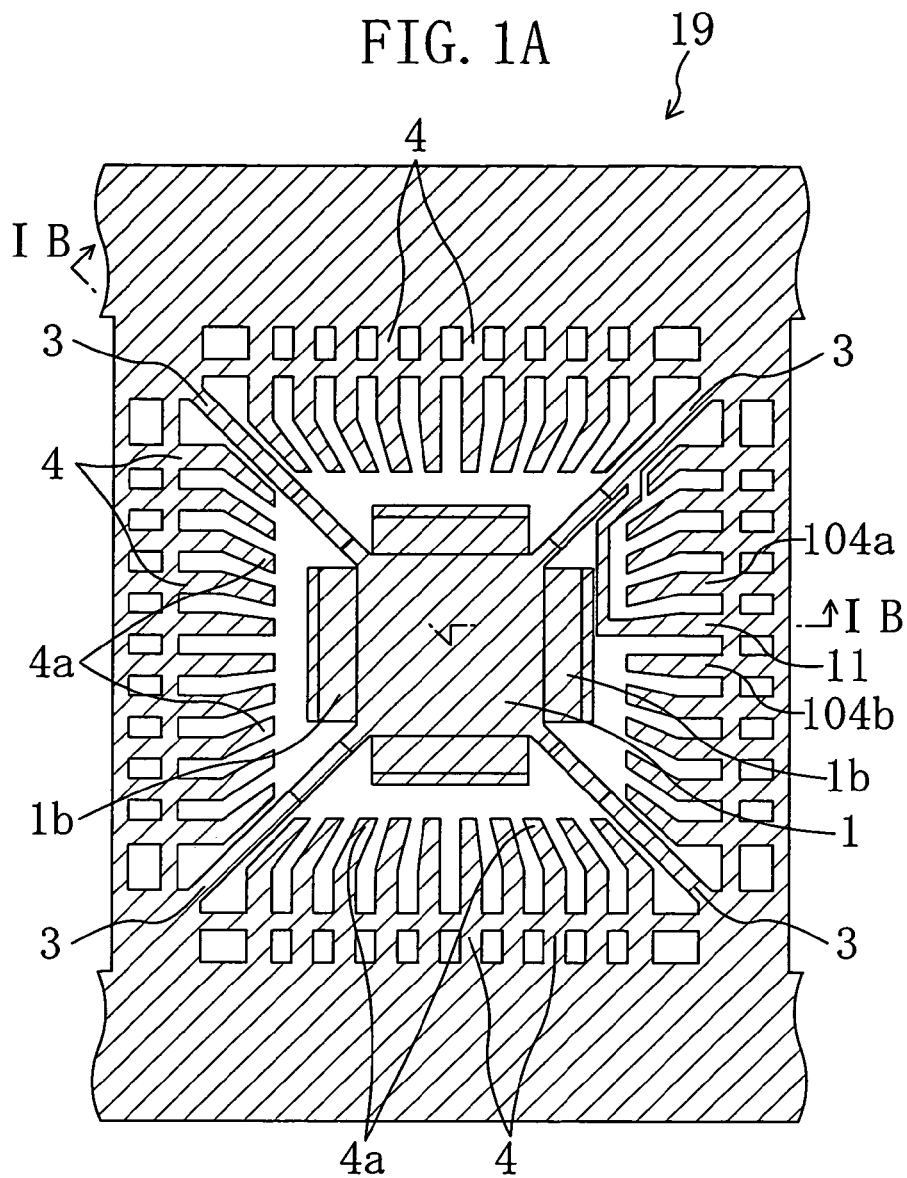
FIGS. 1A and 1B are a plan view and a cross-sectional view, respectively, for explaining a first process step for fabricating a semiconductor device 100 of a first embodiment.

Before description of embodiments of the present invention, a description will be given of the present inventors' analysis on a semiconductor device in which the surface of a semiconductor element opposed to a semiconductor element mounting surface (hereinafter, referred to as "to-be-mounted surface of the semiconductor element") can be grounded and which has excellent heat dissipation ability and moisture-barrier properties and a method for fabricating the same.

First, the present inventors contemplated improving the semiconductor device 500 disclosed in Japanese Unexamined Patent Publication No. 2000-196006 to obtain a semiconductor device in which the to-be-mounted surface of the semiconductor element can be grounded (hereinafter, referred to as "grounding semiconductor device").

The first suggestion is as follows: in the semiconductor device 500, one of the plurality of leads 54, 54, ... is set as a lead connected to a ground terminal (hereinafter, referred to as "GND terminal connecting lead"), and the die pad 51 and the GND terminal connecting lead are connected through the corresponding thin metal wire to each other, thereby grounding the to-be-mounted surface of the semiconductor element. In this case, the die pad 51 and the semiconductor element 52 are electrically connected through a conductive adhesive 57 to each other, and the GND terminal connecting lead and the die pad 51 are electrically connected through the corresponding thin metal wire to each other. Therefore, the GND terminal connecting lead is grounded, thereby grounding the to-be-mounted surface of the semiconductor element.

When the semiconductor element mounting surface 51a has almost the same size as the to-be-mounted surface of the semiconductor element, a part of the semiconductor element mounting surface 51a on which the semiconductor element 52 is not mounted is reduced in area. Therefore, the semiconductor element mounting surface 51a has little space for placing a thin metal wire. As a result, a thin metal wire cannot be used to connect the die pad 51 and the GND terminal connecting lead to each other. In view of the above, when the semiconductor element mounting surface 51a has almost the same size as the to-be-mounted surface of the semiconductor element, a semiconductor device according to the first suggestion is less useful as a grounding semiconductor device.

Inner leads 54b and the GND terminal connecting lead are in the same plane, and as shown in FIG. 23, the die pad 51 is located in a plane different from that of each inner lead 54b. Thus, the die pad 51 is located in a plane different from that of the GND terminal connecting lead. In view of the above, it is not easy to connect the die pad 51 to the GND terminal connecting lead through a thin metal wire. In addition, since the die pad 51 has wings (extensions) 51b, the thin metal wire might come into contact with one of the wings 51b in connecting the die pad 51 to the GND terminal connecting lead through the same thin metal wire. If the thin metal wire comes into contact with one of the wings 51b, a break of the thin metal wire or the separation of the thin metal wire from the die pad 51 or the GND terminal connecting lead will occur. If the thin metal wire is not connected to both the GND terminal connecting lead and the die pad 51, the GND terminal connecting lead is not electrically connected to the die pad 51. In this case, even if the GND potential is applied to the GND terminal connecting lead, the to-be-mounted surface of the semiconductor element 52 cannot be grounded. Therefore, the semiconductor device according to the first suggestion does not become available as a grounding semiconductor device.

In order to solve the above problems of the first suggestion, the present inventors contemplated providing a grounding semiconductor device that does not cause a break of thin metal wires or the separation of thin metal wires from a die pad 51 or a GND terminal connecting lead during the fabrication of the grounding semiconductor device. More particularly, the second suggestion is that at least one of suspension leads (suspension members) 53 is connected through the corresponding thin metal wire to the corresponding GND terminal connecting lead to ground the to-be-mounted surface of the semiconductor element. In this case, the GND terminal connecting leads are electrically connected through the thin metal wires and the suspension leads 53 to the die pad 51. Thus, the to-be-mounted surface of the semiconductor element can be grounded by grounding the GND terminal connecting lead. Unlike the first suggestion, there is an extremely low possibility that, when the suspension leads 53 are connected through the thin metal wires to the GND terminal connecting leads, respectively, any of the thin metal wires will come into contact with any of the wings 51b. Thus, the semiconductor device according to the second suggestion has substantially no possibility of deterioration in performance, because the to-be-mounted surface of the semiconductor element 52 can certainly be grounded under the use of the semiconductor device. Thus, the semiconductor device seems to be useful as a grounding semiconductor device.

The semiconductor device according to the second suggestion need use the leads adjacent to the suspension leads 53 as GND terminal connecting leads. The reason for this is as follows. When the leads adjacent to the suspension leads 53 are not used as the GND terminal connecting leads, some leads exist between each suspension lead 53 and the corresponding GND terminal connecting lead. More particularly, each of thin metal wires for grounding (hereinafter, referred to as "thin grounding metal wires") through which the GND terminal connecting leads are connected to the corresponding suspension leads is provided to pass over some leads existing between the associated suspension lead 53 and GND terminal connecting lead or to pass over thin metal wires through which the leads existing therebetween are connected to the semiconductor element 52. Therefore, when the GND terminal connecting leads are connected to the respective suspension leads 53, the thin grounding metal wires might come into contact with some of the leads or some of the thin metal wires, leading to breaks of the thin grounding metal wires or the separation of the thin grounding metal wires from the die pad 51 or the GND terminal connecting leads. In order to avoid the breaks of the thin grounding metal wires or separation of the thin grounding metal wires from the die pad 51 or the GND terminal connecting leads, the leads adjacent to the suspension leads 53 need be used as GND terminal connecting leads. As a result, the position of each GND terminal connecting lead is determined, leading to the limited layout of the semiconductor device. In view of the above, the semiconductor device according to the second suggestion is also less useful as a grounding semiconductor device.

In order to solve the above problem of the second suggestion, the present inventors contemplated providing a grounding semiconductor device that does not have any limitation on the layout of a semiconductor device. This third suggestion is that at least one of suspension leads 53 is connected to the top surface of the semiconductor element 52 not through a GND terminal connecting lead but through a thin metal wire. To be specific, at least one GND pad is provided on the top surface of the semiconductor element 52, and the GND pad is connected to one of the suspension leads 53. However, unless the GND pad is placed on the corresponding corner of the top surface of the semiconductor element 52, a thin grounding metal wire through which at least one of the suspension leads 53 is connected to the corresponding GND pad will be provided to pass over other thin metal wires. Therefore, the thin grounding metal wire might come into contact with the other thin metal wires, leading to the possibility that a break of the thin grounding metal wire or the separation of the thin grounding metal wire from the die pad 51 or the GND terminal connecting lead is caused. In order to avoid the break of the thin grounding metal wire or the separation of the thin grounding metal wire from the die pad 51 or the GND terminal connecting lead, the GND pad need be placed on the corresponding corner of the top surface of the semiconductor element 52. As a result, in this case, the shape of the semiconductor element 52 is limited. In view of the above, it is found that all of the semiconductor devices according to the first, second and third suggestions are less useful as grounding semiconductor devices.

Next, the present inventors contemplated applying the structure of the semiconductor device 600 disclosed in Japanese Unexamined Patent Publication No. 11-168169 to the semiconductor device 500 disclosed in Japanese Unexamined Patent Publication No. 2000-196006.

More particularly, the fourth suggestion is that a ground connecting part 68 of the semiconductor device 600 is provided on the semiconductor device 500. In this case, in a semiconductor device according to the fourth suggestion, a die pad 51 and a ground connecting part are connected to each other through at least one thin metal wire, the ground connecting part and inner leads for grounding (hereinafter, referred to as "grounding inner leads") are connected to each other through other thin metal wires, and the grounding inner leads are grounded. In this way, the to-be-mounted surface of a semiconductor element can be grounded. Since the die pad 51 has wings 51b, the distance between the distal end of each wing 51b and the end of each inner lead 54b is shorter than the distance between the end of the tub 61 and the end of each grounding inner lead 64b' of the semiconductor device 600 in Japanese Unexamined Patent Publication No. 11-168169. Hence, the region of the semiconductor device where the ground connecting part is to be formed becomes very small, resulting in a very thin ground connecting part. Therefore, it cannot be said that there is no possibility that the ground connecting part might be destroyed during a semiconductor device fabricating process. Since the die pad 51 and each grounding inner lead are connected to each other through the ground connecting part, the destruction of the ground connecting part disenables the semiconductor device of the fourth suggestion to function as a grounding semiconductor device.

Furthermore, a very thin ground connecting part facilitates displacing the ground connecting part in a space inside the semiconductor device. If the ground connecting part is displaced in a space inside the semiconductor device, this causes breaks in the thin metal wire through which the die pad 51 is connected to the ground connecting part or the thin metal wires through which the ground connecting part is connected to the grounding inner leads. In view of the above, like the semiconductor devices according to the first through third suggestions, it is found that the semiconductor device according to the fourth suggestion is also less useful as a grounding semiconductor device.

After the above contemplation, the present inventors found the present invention in which the to-be-mounted surface of a semiconductor element is grounded without using thin conductive wires. Embodiments of the present invention will be described hereinafter with reference to the drawings. The following embodiments are only described as examples, and thus the present invention is not limited to these embodiments. In the first through fourth embodiments that will be described below, it is assumed that the level of a die pad of each semiconductor device is lower than that of each lead thereof.

Embodiment 1

This embodiment will be described below with reference to FIGS. 1A through 6.

Figure 5A:
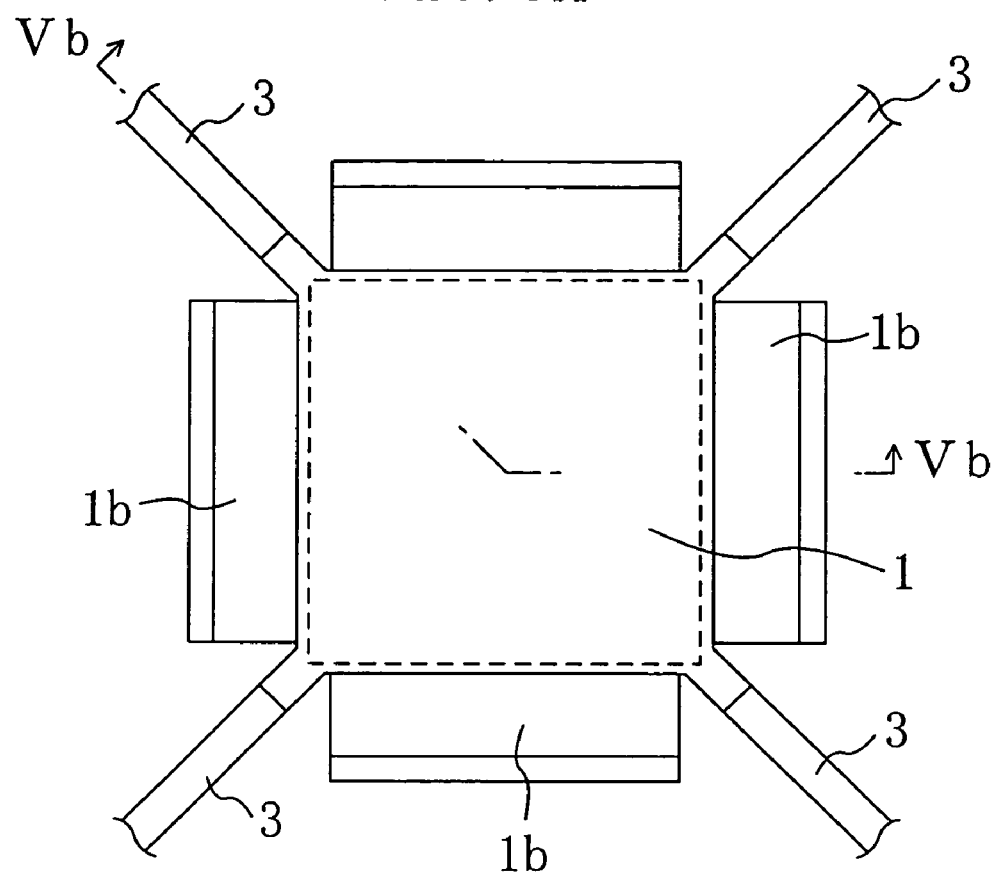
FIGS. 5A and 5B are an enlarged plan view and an enlarged cross-sectional view, respectively, for explaining the first process step for fabricating the semiconductor device 100 of the first embodiment.
Figure 5B:
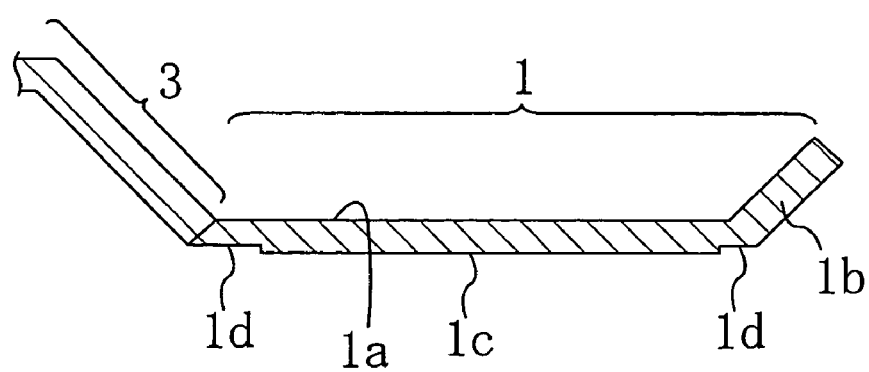
Figure 6:
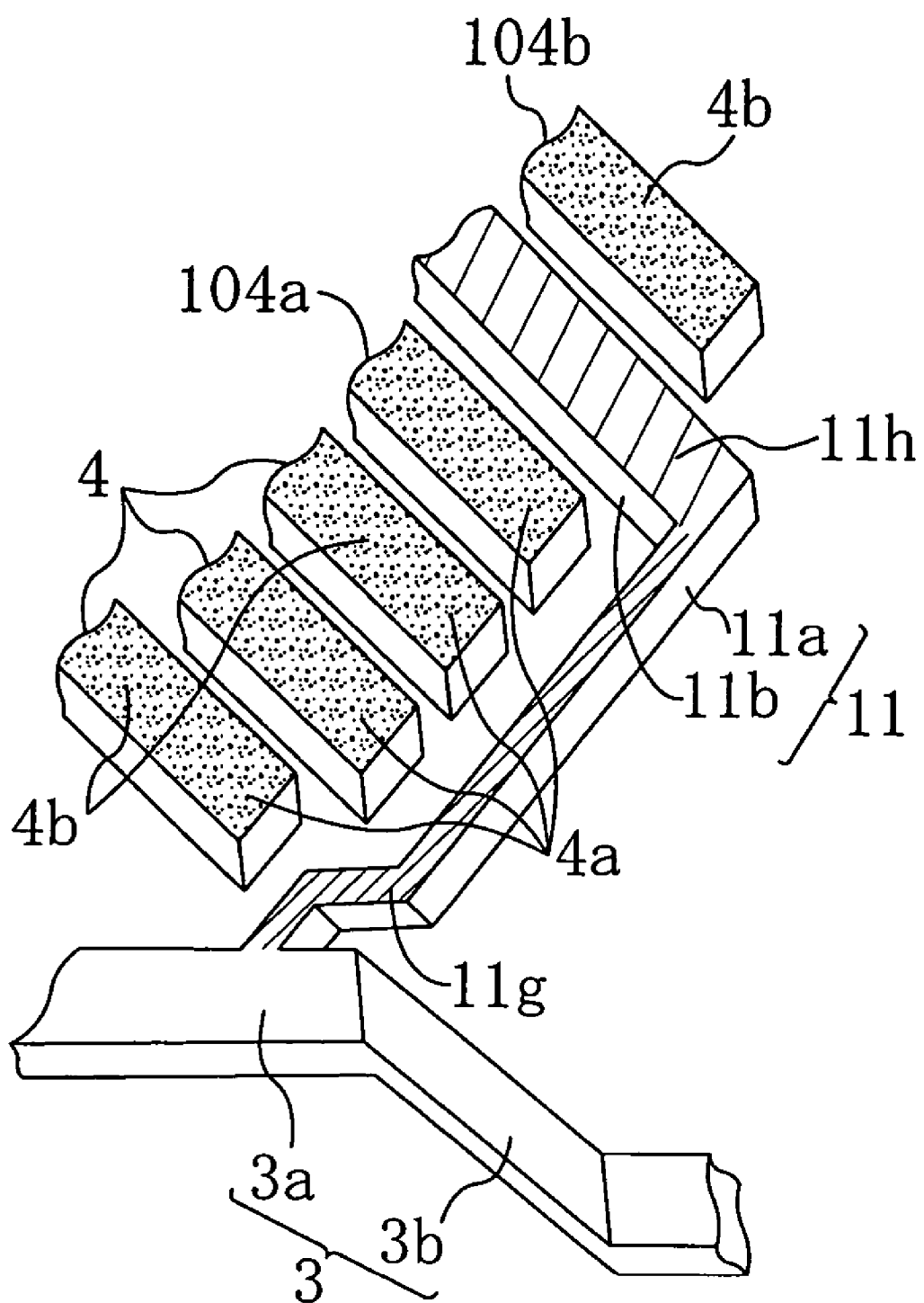
FIG. 6 is another enlarged view for explaining the first process step for fabricating the semiconductor device 100 of the first embodiment.

In this embodiment, a description will be given of a method for fabricating a semiconductor device 100, the structure of the semiconductor device 100 of the present invention and a mechanism of the semiconductor device 100 for grounding a to-be-mounted surface 2a of a semiconductor element 2. FIGS. 1A through 4B are diagrams for explaining a semiconductor device 100 fabricating method. FIGS. 5A and 5B are enlarged views showing a die pad 1. FIG. 6 is a perspective view showing a grounding lead 11. FIGS. 1B, 2B, 3B, and 4B are cross-sectional views taken along the lines IB, IIB, IIIB, and IVB in FIGS. 1A, 2A, 3A, and 4A, respectively.

Figure 1B:
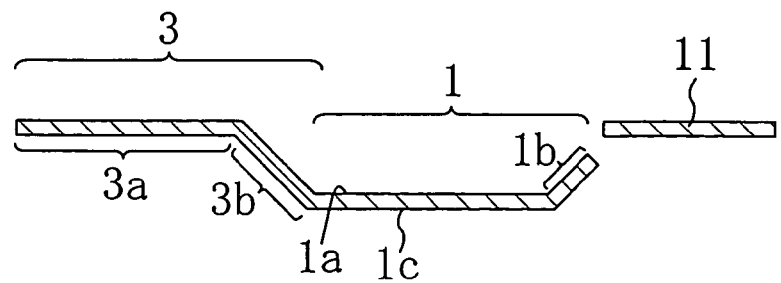

When a semiconductor device 100 is to be fabricated, a conductive plate material is first prepared. The conductive plate material is subjected to an etching process and a pressing process, thereby integrally forming a die pad 1 on which a quadrilateral semiconductor element 2 is to be mounted, a plurality of suspension members 3, 3, . . . formed continuously with the die pad 1 and extending outward from the die pad 1, a plurality of leads 4, 4, . . . provided between adjacent two of the suspension members 3 and each having one end 4a opposed to a corresponding edge of the semiconductor element (hereinafter, referred to as "lead end 4a opposed to the semiconductor element"), and a grounding lead 11 extending from one of the suspension members 3 and formed, in part, generally parallel to the leads 4. In this way, a lead frame 19 is fabricated as shown in FIGS. 1A and 1B. Hatching in FIG. 1A shows not a cross section but a part of the conductive plate material left without being etched through an etching process.

Figure 2A:
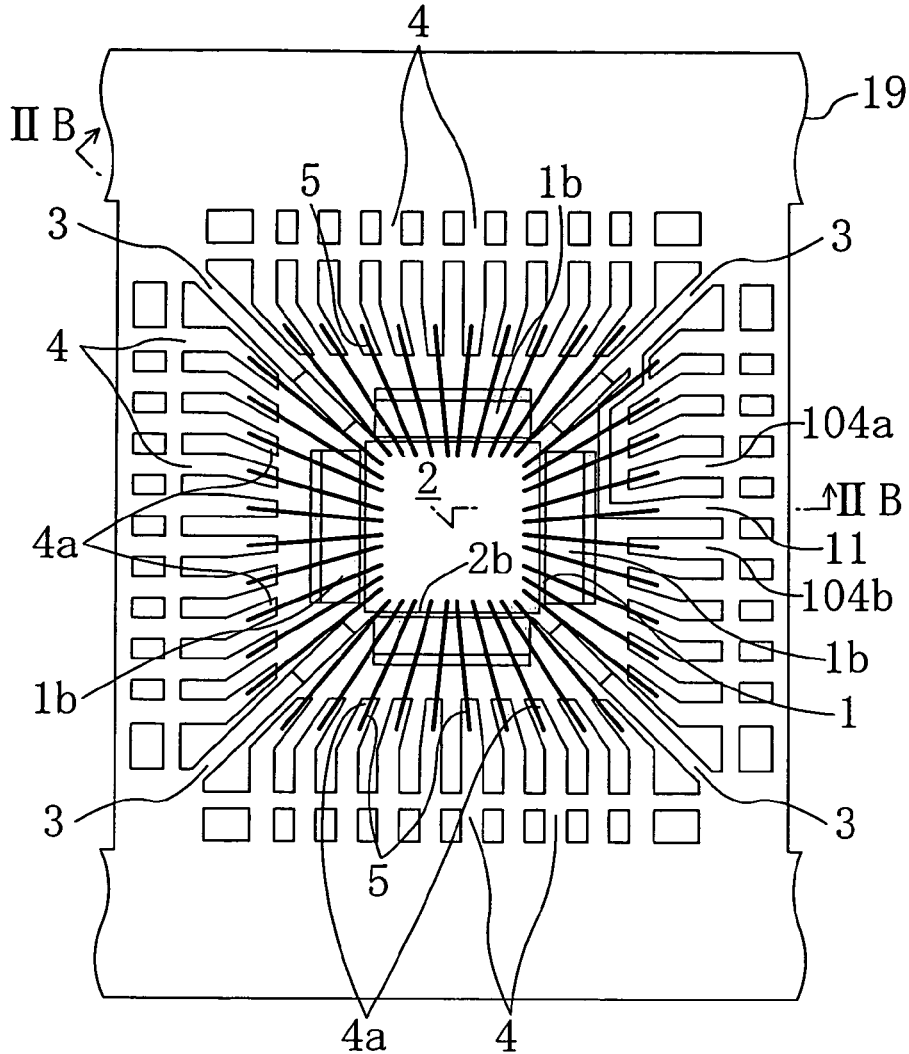
FIGS. 2A and 2B are a plan view and a cross-sectional view, respectively, for explaining a second process step for fabricating the semiconductor device 100 of the first embodiment.
Figure 2B:
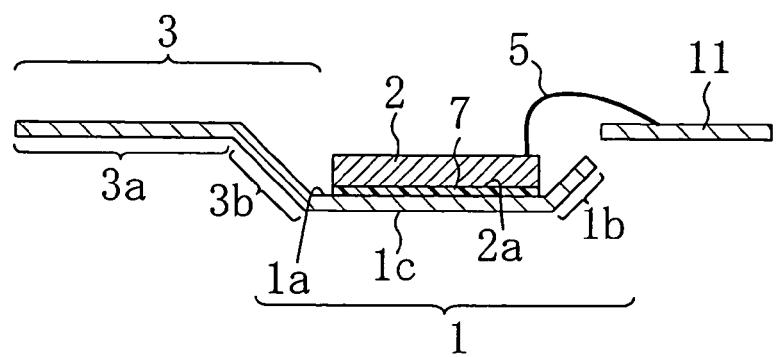

When the die pad 1 is to be formed, a semiconductor element mounting surface 1a of the die pad 1 is formed to be larger than a to-be-mounted surface 2a of a semiconductor element (shown in FIG. 2B). Then, the end of a part of the die pad 1 expanding outward from a part thereof on which the semiconductor element 2 is to be mounted is bent so as to be directed to the leads 4, thereby forming extensions 1b. In this way, a semiconductor device with excellent moisture-barrier properties can be fabricated. Furthermore, as shown in FIG. 5, an indentation 1d is formed by cutting the periphery of the surface 1c (hereinafter, referred to as "exposed surface 1c") of the die pad 1 opposite to the semiconductor element mounting surface 1a. Thus, a region where thin burrs are to be formed can be reduced in a sealing process that will be described later.

When the suspension members 3 are to be formed, the conductive plate material is depressed to form flat parts 3a and slope parts 3b as shown in FIG. 1B. The formation of the slope parts 3b allows the semiconductor element mounting surface 1a to be formed below the flat parts 3a. When the semiconductor element mounting surface 1a is formed below the flat parts 3a as shown in FIG. 1B, the exposed surface 1c can be exposed from an encapsulant 6 in a sealing process that will be described later.

When the leads 4 are to be formed, the top surfaces 4b (the surfaces shown by the dotted area in FIG. 6) of parts of the conductive plate material that will be lead ends 4a opposed to the semiconductor element (hereinafter, referred to as "lead end top surface 4b") are formed generally parallel to the semiconductor element mounting surface 1a. As a result, all the lead end top surfaces 4b are formed in substantially the same plane.

When a grounding lead 11, the feature of the present invention, is to be formed, an extension part 11a of the grounding lead 11 extending from one of the suspension members 3 (hereinafter, referred to as "grounding lead extension part 11a") is formed between each lead end 4a opposed to the semiconductor element and the die pad 1 as shown in FIGS. 1A, 1B and 6. Since the grounding lead 11 is thus formed integrally with one of the suspension members 3, the grounding lead 11 is electrically connected to the die pad 1. Furthermore, a part 11b of the grounding lead 11 aligned generally parallel with the leads 4 (hereinafter, referred to as "grounding lead parallel part 11b") is formed between one 104a and another 104b of the leads 4. The top surface 11g of the grounding lead extension part 11a parallel to the semiconductor element mounting surface 1a and the top surface 11h of the grounding lead parallel part 11b parallel to the semiconductor element mounting surface 1a are formed in substantially the same plane (wherein the top surfaces 11g and 11h are the surfaces diagonally shaded in the opposite directions to each other in FIG. 6). In addition, the top surface 11h of the grounding lead parallel part 11b and the lead end top surfaces 4b are formed in substantially the same plane.

As seen from the above, the semiconductor element mounting surface 1a is formed below the flat parts 3a, and the following surfaces are formed in substantially the same plane: the top surfaces of the flat parts 3a parallel to the semiconductor element mounting surface 1a; the respective lead end top surfaces 4b of the leads 4; the top surface 11g of the grounding lead extension part 11a; and the top surface 11h of the grounding lead parallel part 11b. As a result, the semiconductor element mounting surface 1a is formed below the leads 4 and the grounding lead 11.

In this embodiment, "substantially the same plane" does not mean the same plane in a mathematical sense but means the same plane to such an extent that the function of the semiconductor device does not deteriorate. Therefore, "substantially the same plane" may be a plane having some bend.

Next, as shown in FIGS. 2A and 2B, a semiconductor element 2 is mounted on the die pad 1. At this time, the semiconductor element 2 is fixed on the semiconductor element mounting surface 1a using a conductive adhesive 7. In this way, the semiconductor element 2 can be fixed on the die pad 1, and the semiconductor element mounting surface 1a can electrically be connected to a to-be-mounted surface 2a of the semiconductor element 2. As a result, the semiconductor element 2 is electrically connected to the grounding lead 11 through the conductive adhesive 7, the die pad 1, and one of the suspension members 3. Thus, the to-be-mounted surface 2a of the semiconductor element 2 can be grounded by electrically connecting the end of the grounding lead 11 to a ground terminal or the like.

The semiconductor element 2 is connected through a plurality of thin conductive wires 5 to the leads 4 and the grounding lead parallel part 11b, respectively. In the region where the grounding lead 11 is provided, some of the thin conductive wires 5 allow the semiconductor element 2 to be connected to the corresponding leads 4 across the grounding lead extension part 11a. In this way, the semiconductor element 2 is electrically connected to the leads 4. Thus, a desired voltage can be applied to the semiconductor element 2 by applying a desired voltage to the leads 4. As a result, an available semiconductor device can be obtained.

Figure 3A:
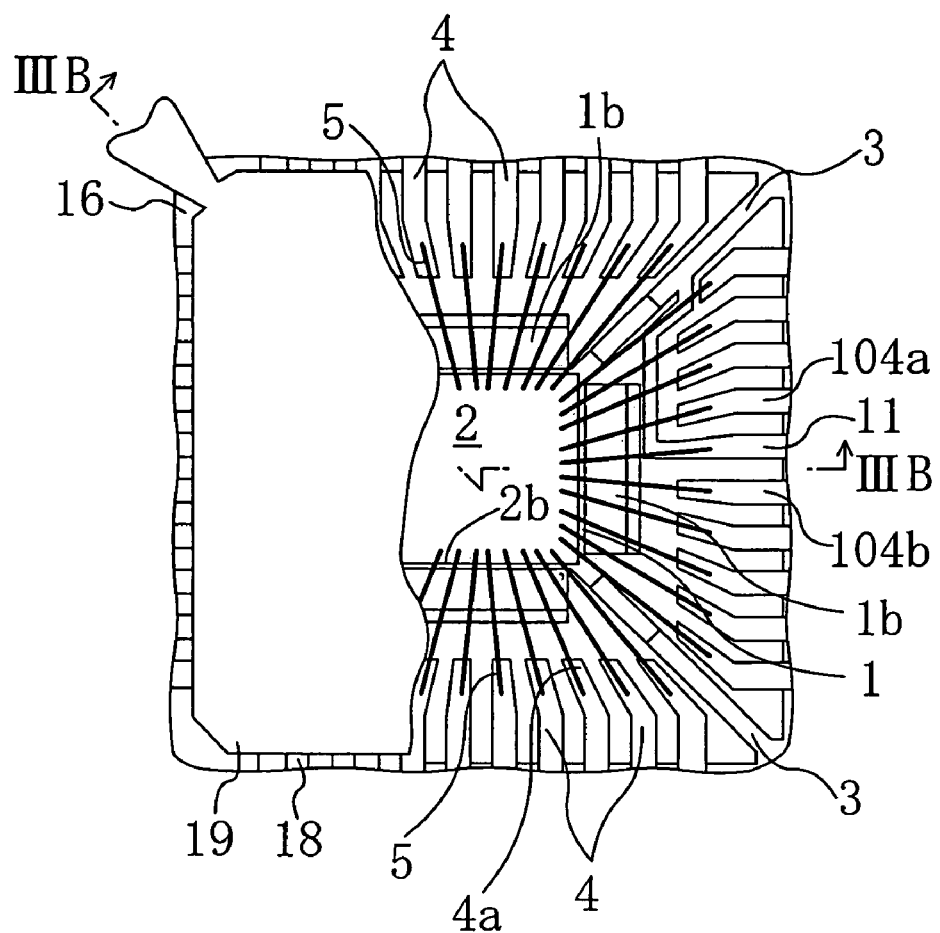
FIGS. 3A and 3B are a plan view and a cross-sectional view, respectively, for explaining a third process step for fabricating the semiconductor device 100 of the first embodiment.
Figure 3B:
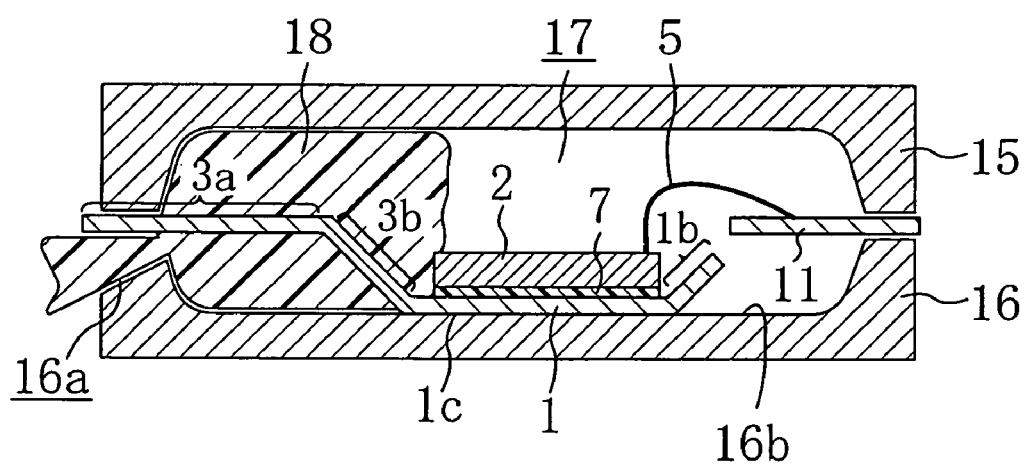

Thereafter, as shown in FIGS. 3A and 3B, the die pad 1, the semiconductor element 2, the suspension members 3, parts of the leads 4, the thin conductive wires 5, and the grounding lead 11 are encapsulated using an encapsulant. To be specific, the lead frame 19 including the semiconductor element 2 and the thin conductive wires 5 as shown in FIGS. 2A and 2B is sealed with an upper die 15 and a lower die 16 having an injection hole 16a as shown in FIG. 3B. At this time, the exposed surface 1c is allowed to abut against the inner wall surface 16b of the lower die 16. In this way, a semiconductor device 100 with excellent heat dissipation ability can be fabricated. Furthermore, the ends of the leads 4 opposite to the lead ends 4a opposed to the semiconductor element 2 and the end of the grounding lead 11 are allowed to protrude from the upper die 15 and the lower die 16 to the outside. A resin 18 that will constitute an encapsulant is injected through the injection hole 16a into a space 17 formed by allowing the upper die 15 to engage with the lower die 16. After the curing of the resin 18, the upper die 15 and the lower die 16 are removed. Thus, the die pad 1, the semiconductor element 2, the suspension members 3, the parts of the leads 4, the thin conductive wires 5, and the grounding lead 11 can be encapsulated. In this way, an encapsulant can be formed. Then, parts of the leads 4 and a part of the grounding lead 11 both protruding from the upper die 15 and the lower die 16 to the outside are processed to each have a predetermined shape. In this way, the semiconductor device 100 can be fabricated. FIG. 3A shows the semiconductor device 100 when the upper die 15 is removed therefrom.

Figure 4A:
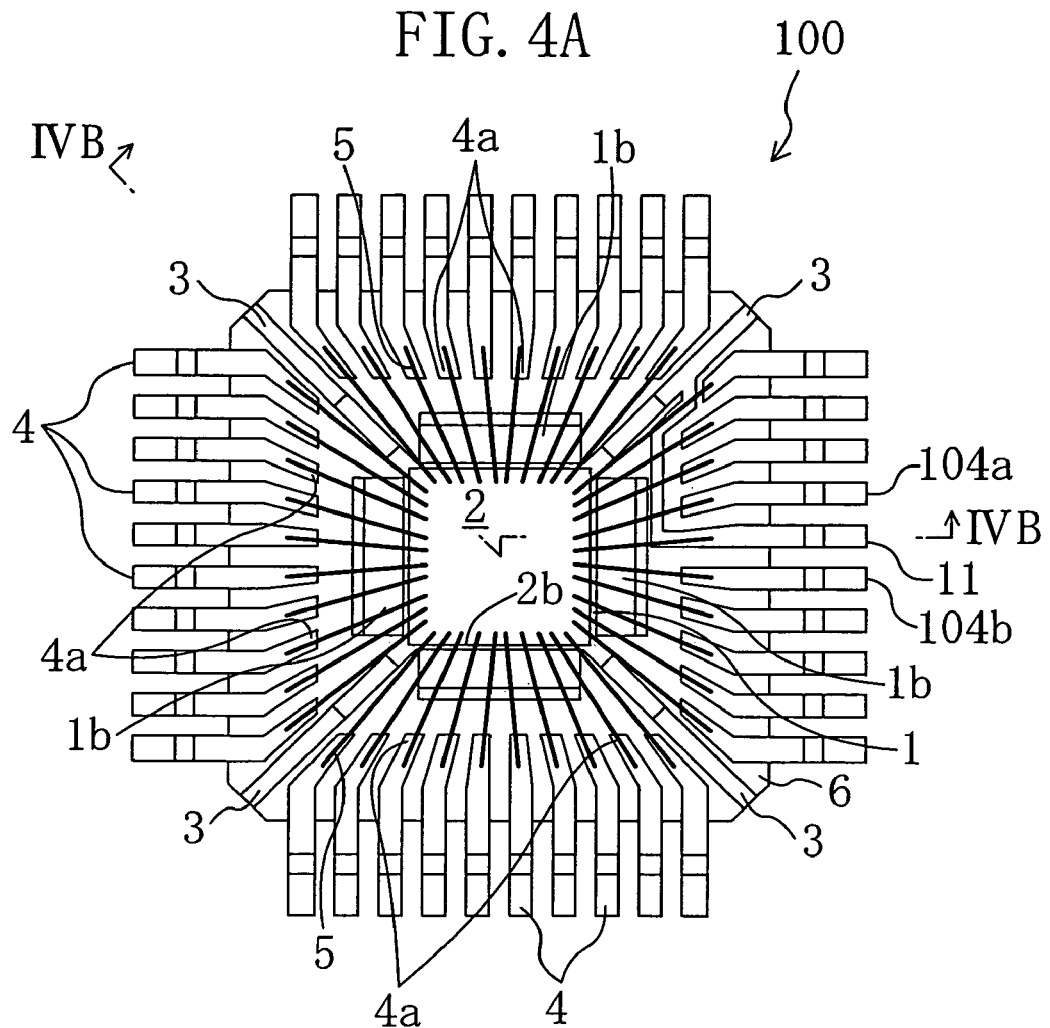
FIGS. 4A and 4B are a plan view and a cross-sectional view, respectively, for explaining a fourth process step for fabricating the semiconductor device 100 of the first embodiment.
Figure 4B:
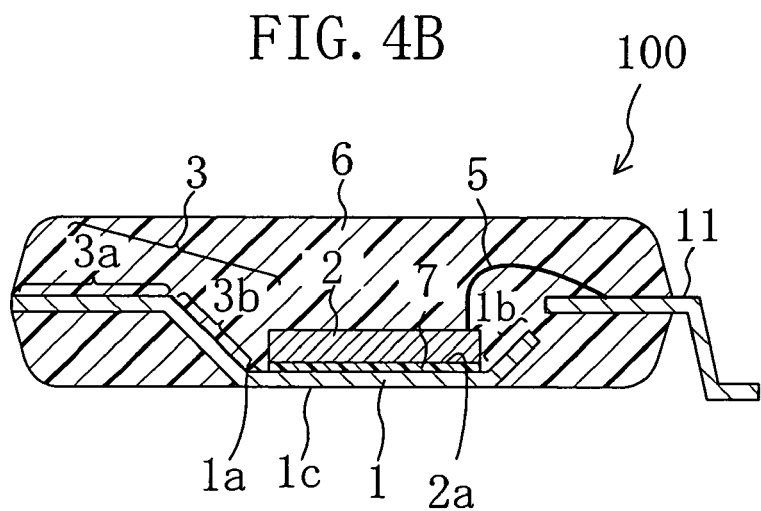

As shown in FIGS. 4A and 4B, the semiconductor device 100 fabricated through the above process steps comprises the die pad 1, the quadrilateral semiconductor 2 mounted on the semiconductor element mounting surface 1a using a conductive adhesive 7, the plurality of suspension members 3, 3, . . . formed continuously with the die pad 1 and extending outward from the die pad 1, the plurality of leads 4, 4, . . . provided between adjacent two of the suspension members 3 and each having the lead end 4a opposed to a corresponding edge 2b of the semiconductor element 2, the plurality of the thin conductive wires 5, 5, . . . through which the semiconductor element 2 is connected to the leads 4, respectively, the grounding lead 11 extending from one of the suspension members 3 and formed, in part, generally parallel to the leads 4, and an encapsulant 6 for encapsulating the die pad 1, the semiconductor element 2, the suspension members 3, the parts of the leads 4, the thin conductive wires 5, and the grounding lead 11. Each suspension member 3 has a slope part 3b, and the suspension members 3, the leads 4 and the grounding lead 11 are formed in substantially the same plane. Therefore, the semiconductor element mounting surface 1a is located in a plane different from the plane in which the suspension members 3, the leads 4 and the grounding lead 11 are formed. More specifically, it is located on the lower side of FIG. 4B.

As shown in FIGS. 4A, 4B and 6, the grounding lead 11, the feature of the semiconductor device 100, has the grounding lead extension part 11a extending from one of the suspension members 3 and the grounding lead parallel part 11b formed generally parallel to the leads 4. The grounding lead extension part 11a is located between one edge 2b of the semiconductor element 2 and some of the lead ends 4a opposed to the semiconductor element 2. As shown in FIG. 6, the grounding lead parallel part 11b is located between the leads 104a and 104b. The end of the grounding lead 11 protrudes from the encapsulant 6 to the outside. Therefore, the grounding lead 11 is easily connected to the ground terminal or the like. As long as the grounding lead 11 is connected to, for example, a ground terminal, the to-be-mounted surface 2a of the semiconductor element 2 can be grounded. FIG. 4A is a top view showing the semiconductor device 100, but seen through the encapsulant 6 provided above the semiconductor device 100, because only the encapsulant 6 can be seen from above of the semiconductor device 100.

Next, the mechanism of the semiconductor device 100 for grounding the to-be-mounted surface 2a of the semiconductor element 2 will be described.

As shown in FIG. 4A, the grounding lead 11 is formed integrally with the die pad 1 with one of the suspension members 3 interposed therebetween. Furthermore, the die pad 1, the suspension members 3 and the grounding lead 11 are formed of a conductive material. Therefore, the grounding lead 11 is electrically connected to the die pad 1. Furthermore, as shown in FIG. 2B, the semiconductor element 2 is fixed on the semiconductor element mounting surface 1a through the conductive adhesive 7, and thus the semiconductor element mounting surface 1a is electrically connected to the to-be-mounted surface 2a of the semiconductor element 2. Hence, the grounding lead 11 is electrically connected to the to-be-mounted surface 2a of the semiconductor element 2 through one of the suspension members 3, the die pad 1 and the conductive adhesive 7. Therefore, the grounding of the grounding lead 11 results in the grounded to-be-mounted surface 2a of the semiconductor element 2. As seen from the above, since the semiconductor device 100 can be grounded without using thin conductive wires, this can eliminate the need for connecting a grounding lead through thin conductive wires to a die pad or the like. In addition, there is no possibility of thin conductive wires being cut during a semiconductor device fabricating process, and thus the grounding function of the semiconductor device is not deteriorated or lost. Therefore, the semiconductor device 100 can easily be fabricated and the production yield of the semiconductor devices is increased.

Effects obtained by the semiconductor device 100 and the method for fabricating the semiconductor device 100 of this embodiment will be described hereinafter.

The semiconductor device 100 of this embodiment comprises not only the die pad, the suspension members, the leads, the thin conductive wires, and the encapsulant, i.e., the same components as the known semiconductor device, but also the grounding lead 11 formed of the same conductive material. The grounding lead 11 comprises the grounding lead extension part 11a extending from one of the suspension members 3 and the grounding lead parallel part 11b formed generally parallel to the leads 4. Since the grounding lead 11 is electrically connected to the to-be-mounted surface 2a of the semiconductor element 2, the to-be-mounted surface 2a of the semiconductor element 2 can be grounded by connecting the grounding lead 11 to a ground terminal or the like. Therefore, in the semiconductor device 100, the to-be-mounted surface 2a of the semiconductor element 2 can easily be grounded.

Since in the semiconductor device 100 the grounding lead 11 is formed integrally with one of the suspension members 3, it is not displaced in a space in which the encapsulant 6 is to be formed during the process step of injecting the resin 18 thereinto. Furthermore, since thin conductive wires are not used for grounding, the thin conductive wires are not cut during the semiconductor device fabricating process. Hence, the use of the method for fabricating the semiconductor device 100 of the present invention allows the semiconductor device to be fabricated without causing deterioration and loss of the grounding function. This permits the fabrication of a high-yielding semiconductor device having high performance as a grounding semiconductor device.

Since the to-be-mounted surface 2a of the semiconductor element 2 of the semiconductor device 100 is grounded without using thin conductive wires, the method for fabricating the semiconductor device 100 of the present invention does not include the step of connecting members to each other through thin conductive wires to ground the to-be-mounted surface 2a. Therefore, the semiconductor device 100 can easily be fabricated.

Furthermore, since thin conductive wires are not used to ground the to-be-mounted surface 2a of the semiconductor element 2, not only the position of the grounding lead 11 but also the shape and number of the grounding leads 11 can freely be selected as described in first through third modifications that will be described later. Therefore, the lead frame 19 can be designed without any limitation due to the spatial relationship between members.

Moreover, the semiconductor device 100 comprises the exposed surface 1c exposed from the encapsulant 6. Therefore, heat generated in the semiconductor device 100 is dissipated through the exposed surface 1c to the outside of the semiconductor device, resulting in the semiconductor device 100 having excellent heat dissipation ability. On the other hand, since the semiconductor device 100 comprises the exposed surface 1c, moisture and impurities in the atmosphere penetrate from the exposed surface 1c into the semiconductor device 100. However, since the die pad 1 has the extensions 1b, this prevents the moisture and impurities having penetrated from the exposed surface 1c from coming into contact with the top surface of the semiconductor element 2. Therefore, the semiconductor device 100 has excellent moisture-barrier properties. In addition, since moisture and impurities do not come into contact with the top surface of the semiconductor element 2 even with a long term use of the semiconductor device 100, the semiconductor device 100 has excellent performance without deteriorating the performance of the semiconductor element 2.

Furthermore, since the indentation 1d is formed around the periphery of the exposed surface 1c, pressures applied to the upper die 15 and the lower die 16 can be reduced in injecting the resin 18 into the space 17. Therefore, when the resin 18 is encapsulated, there is no possibility of the upper die 15 and the lower die 16 being broken. The formation of the indentation 1d permits an excess resin 18 that could not reach the space 17 to be collected into the indentation 1d. Therefore, the excess resin 18 is blocked by the indentation 1d. This can prevent the resin 18 from flowing into the exposed surface 1c. Hence, there is no possibility of the resin 18 coming into contact with the exposed surface 1c, and thus the exposed surface 1c can effectively be utilized. For example, the exposed surface 1c can be soldered to the other conductive material.

In short, the semiconductor device 100 and the method for fabricating the same of this embodiment are more excellent than the known semiconductor device and the method for fabricating the same in the following effects: the semiconductor device 100 has high performance as a grounding semiconductor device; the production yield is high; the semiconductor device 100 can easily be fabricated; the placement of each member of a lead frame is not limited; and the semiconductor device 100 has excellent moisture-barrier properties and heat dissipation ability.

The shape of a grounding lead is not limited to the shape of the grounding lead 11 of this embodiment. Modifications 1 through 3 of this embodiment will be described hereinafter with reference to FIGS. 7 through 9, respectively. Respective semiconductor devices 110 and 120 of Modifications 1 and 2 are different from the semiconductor device 100 of this embodiment only in the shape of a grounding lead. The same components of Modifications 1 and 2 as those of this embodiment will not be described below.

(Modification 1)

Figure 7:
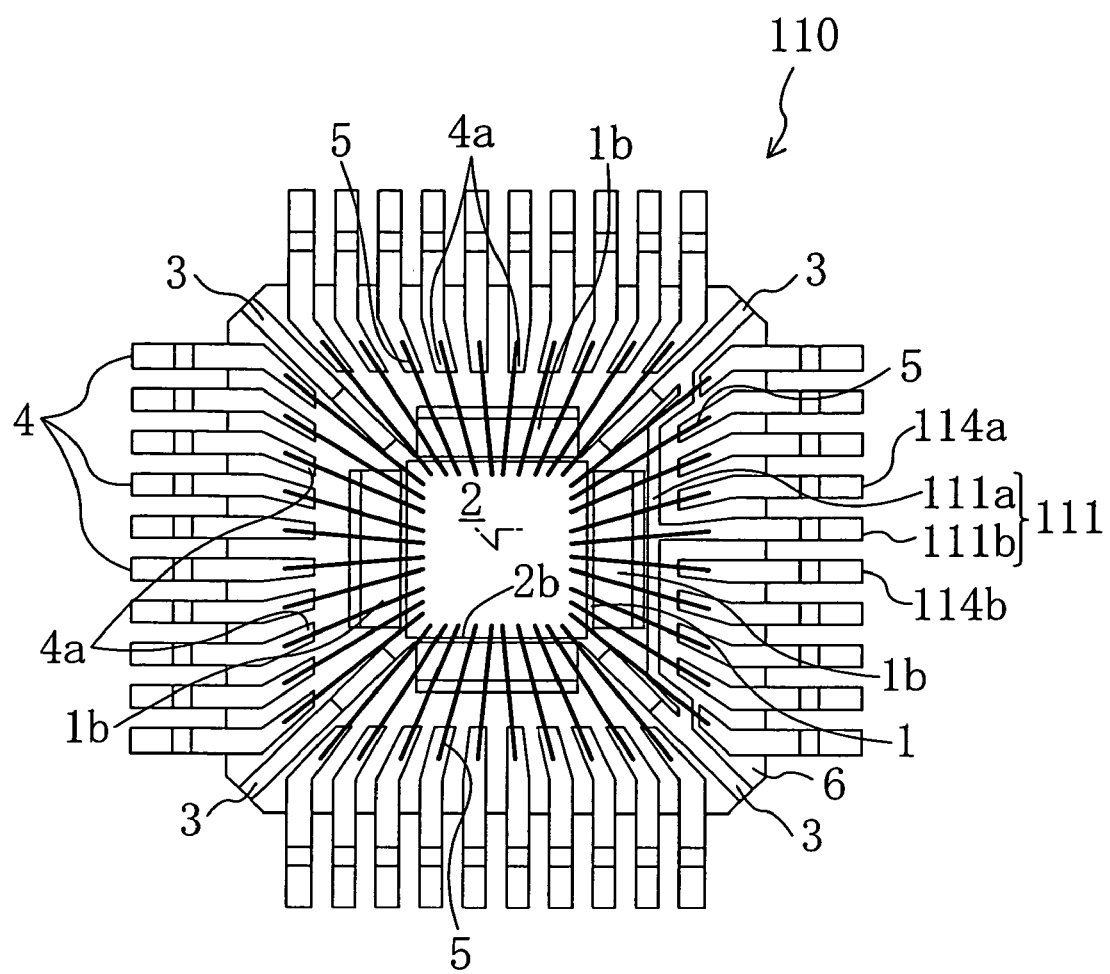
FIG. 7 is a plan view showing a semiconductor device 110 according to Modification 1 of the first embodiment.

FIG. 7 is a plan view showing a semiconductor device 110 according to the first modification. A grounding lead 111 of Modification 1 is generally T-shaped. The semiconductor device 110 is the same as the semiconductor device 100 of this embodiment in the other points.

More specifically, when the grounding lead 111 is to be formed, a grounding lead extension part 111a extending from adjacent two of suspension members 3 is located between lead ends 4a opposed to a semiconductor element 2 and a die pad 1, and a grounding lead parallel part 111b is formed to extend from some midpoint of the grounding lead extension part 111a and located between a lead 114a and another lead 114b. A method for fabricating the semiconductor device 110, the structure thereof, and the mechanism thereof for grounding the to-be-mounted surface of the semiconductor element are the same as those of the semiconductor device 100 of this embodiment in the other points.

The following effect is obtained by the first modification in addition to the above effects obtained by this embodiment. Since the grounding lead extension part 111a is fixed by adjacent two of the suspension members 3, this can further prevent the grounding lead 111 from being displaced.

(Modification 2)

Figure 8:
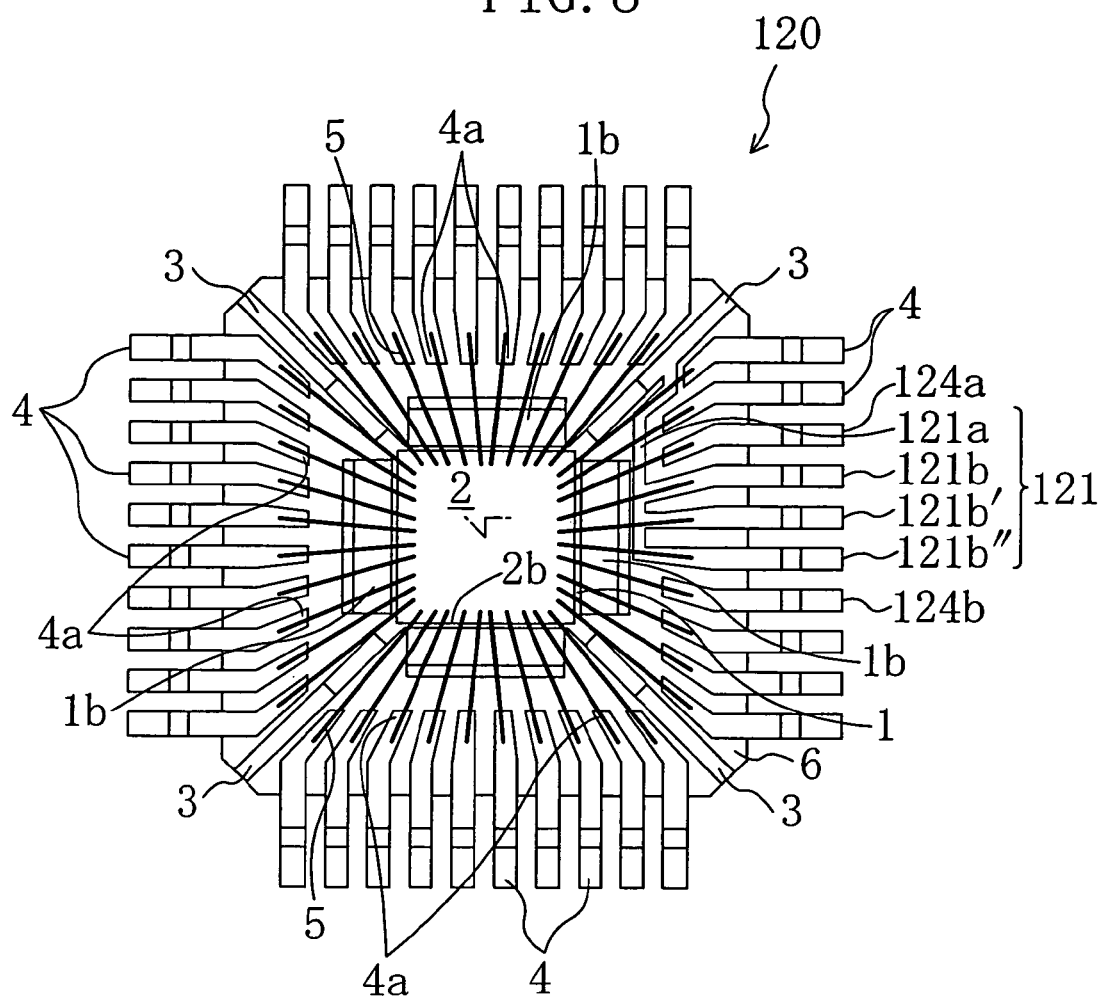
FIG. 8 is a plan view showing a semiconductor device 120 according to Modification 2 of the first embodiment.

FIG. 8 is a plan view showing a semiconductor device 120 of Modification 2. A grounding lead 121 has a plurality of grounding lead parallel parts. The semiconductor device 120 of the second modification is the same as the semiconductor device 100 of this embodiment in the other points.

More specifically, when the grounding lead 121 is to be formed, a plurality of grounding lead parallel parts 121b are formed. To be specific, grounding lead parallel parts 121b, 121b', 121b" are located between a lead 124a and another lead 124b. A method for fabricating the semiconductor device 120, the structure thereof, and the mechanism thereof for grounding the to-be-mounted surface of the semiconductor element are the same as those of the semiconductor device 100 of this embodiment in the other points.

The following effects are obtained by Modification 2 in addition to the above effects obtained by this embodiment. The provision of the plurality of grounding lead parallel parts 121b, 121b' and 121b" allows the to-be-mounted surface 2a of a semiconductor element 2 to be grounded if any one of the ends of the grounding lead parallel parts is connected to a ground terminal or the like. Thus, for example, if the to-be-mounted surface 2a of the semiconductor element 2 has long been kept grounded with the end of the grounding lead parallel part 121b connected to a ground terminal or the like so that the conductivity of the grounding lead parallel part 121b has been reduced, the to-be-mounted surface 2a of the semiconductor element 2 can in turn be grounded by connecting the end of the grounding lead parallel part 121b' or 121b" to a ground terminal or the like. Thus, in this case, the semiconductor device 120 can be used as a grounding semiconductor device for a long time.

(Modification 3)

Figure 9:
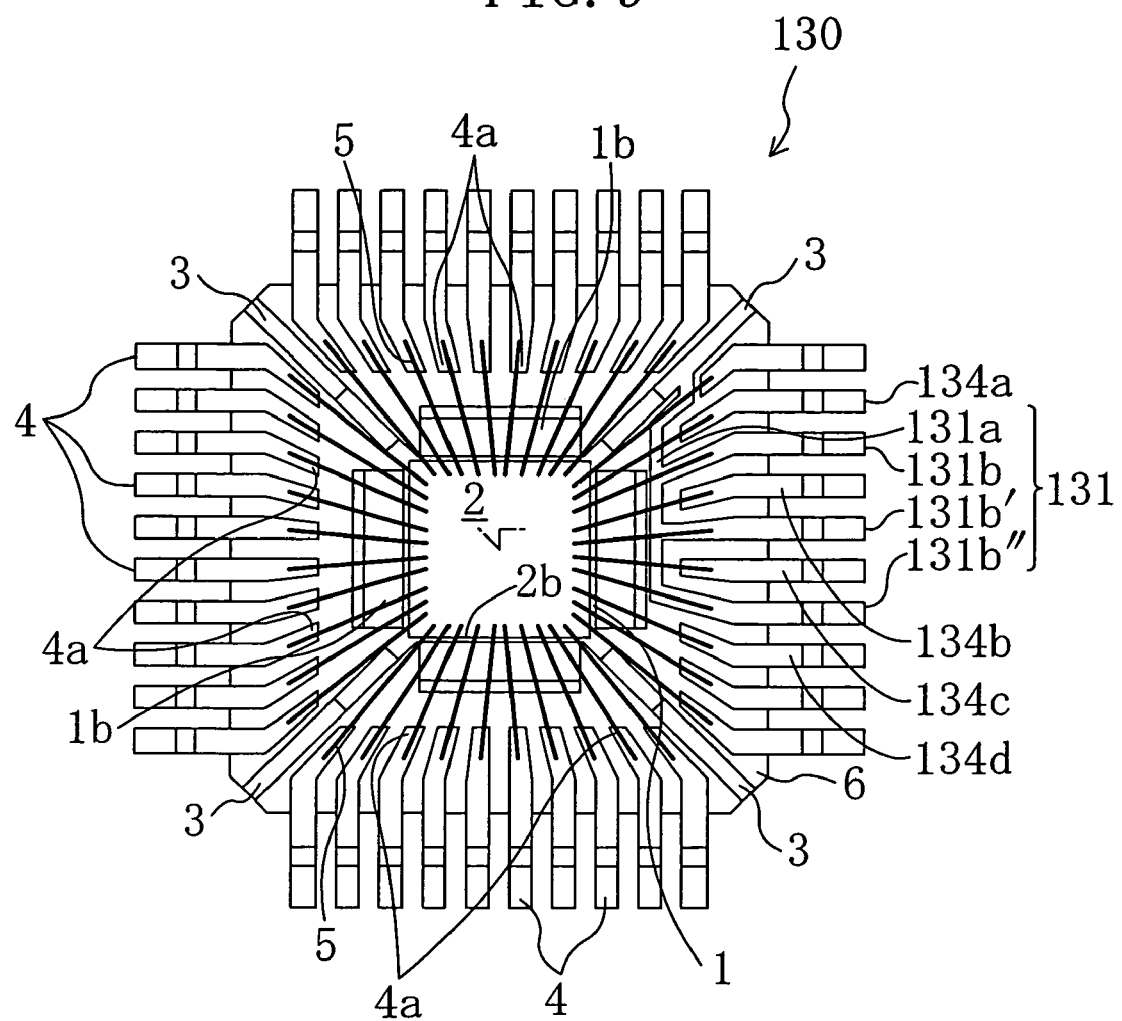
FIG. 9 is a plan view showing a semiconductor device 130 according to Modification 3 of the first embodiment.

FIG. 9 is a plan view showing a semiconductor device 130 of Modification 3. A grounding lead 131 of Modification 3 has a plurality of grounding lead parallel parts, each of which is located between a lead and another lead. The semiconductor device 130 of Modification 3 is the same as the semiconductor device 100 of this embodiment in the other points.

Specifically, when the grounding lead 131 is to be formed, a plurality of grounding lead parallel parts 131b are formed. To be more specific, a first grounding lead parallel part 131b is located between a lead 134a and another lead 134b, a second grounding lead parallel part 131b' is located between the lead 134b and still another lead 134c, and a third grounding lead parallel part 131b" is located between the lead 134c and yet another lead 134d. A method for fabricating the semiconductor device 130, the structure thereof, and the mechanism thereof for grounding the to-be-mounted surface of the semiconductor element are the same as those of the semiconductor device 100 of this embodiment in the other points.

The following effects are obtained by Modification 3 in addition to the above effects of this embodiment. The provision of the plurality of grounding lead parallel parts 131b, 131b' and 131b" allows the to-be-mounted surface 2a of a semiconductor element 2 to be grounded if any one of the ends of the grounding lead parallel parts is connected to a ground terminal or the like. Furthermore, even if, for example, the grounding lead parallel part 131b cannot be connected to a ground terminal due to spatial limitations, the to-be-mounted surface 2a of the semiconductor element 2 can be grounded as long as the end of the grounding lead parallel part 131b' or 131b" can be connected to a ground terminal or the like. The reason for this is that the grounding lead parallel parts are located away from one another. In view of the above, the applicable range of the semiconductor device 130 can be expanded.

Embodiment 2

Figure 12:
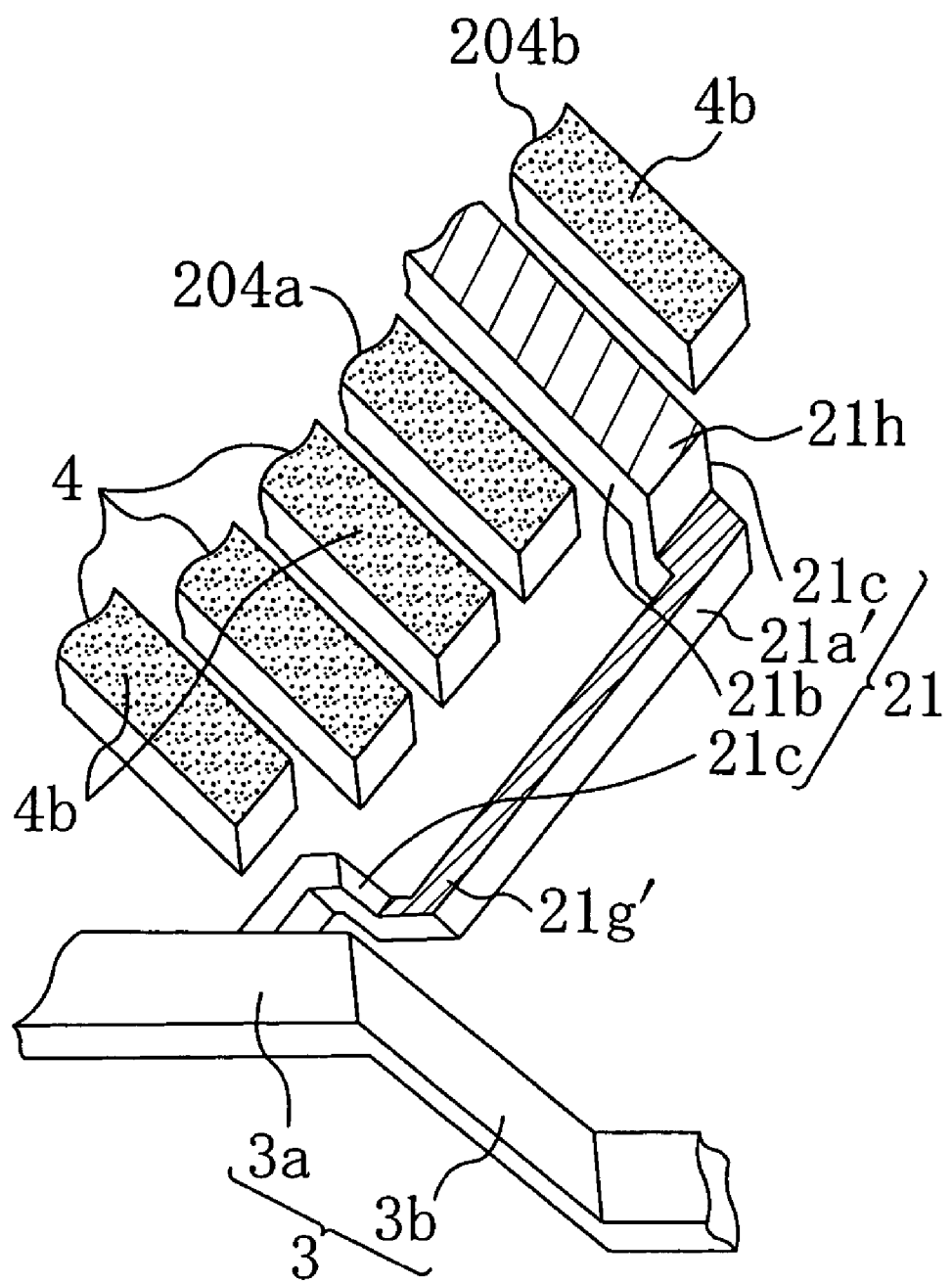
FIG. 12 is an enlarged view for explaining the first process step for fabricating the semiconductor device 200 of the second embodiment.

A semiconductor device of this embodiment will be described hereinafter with reference to FIGS. 10A through 12. It is different from the semiconductor device 100 of the first embodiment in the shape of a grounding lead. The same components of the semiconductor device of this embodiment as those of the first embodiment will not be described in detail. FIGS. 10A through 11B are diagrams for explaining a method for fabricating a semiconductor device 200, and FIG. 12 is a perspective view showing a grounding lead 21. The same numerals are given to components having the same structures and functions as those of the components shown in FIGS. 1A through 6 of the first embodiment.

Figure 10A:
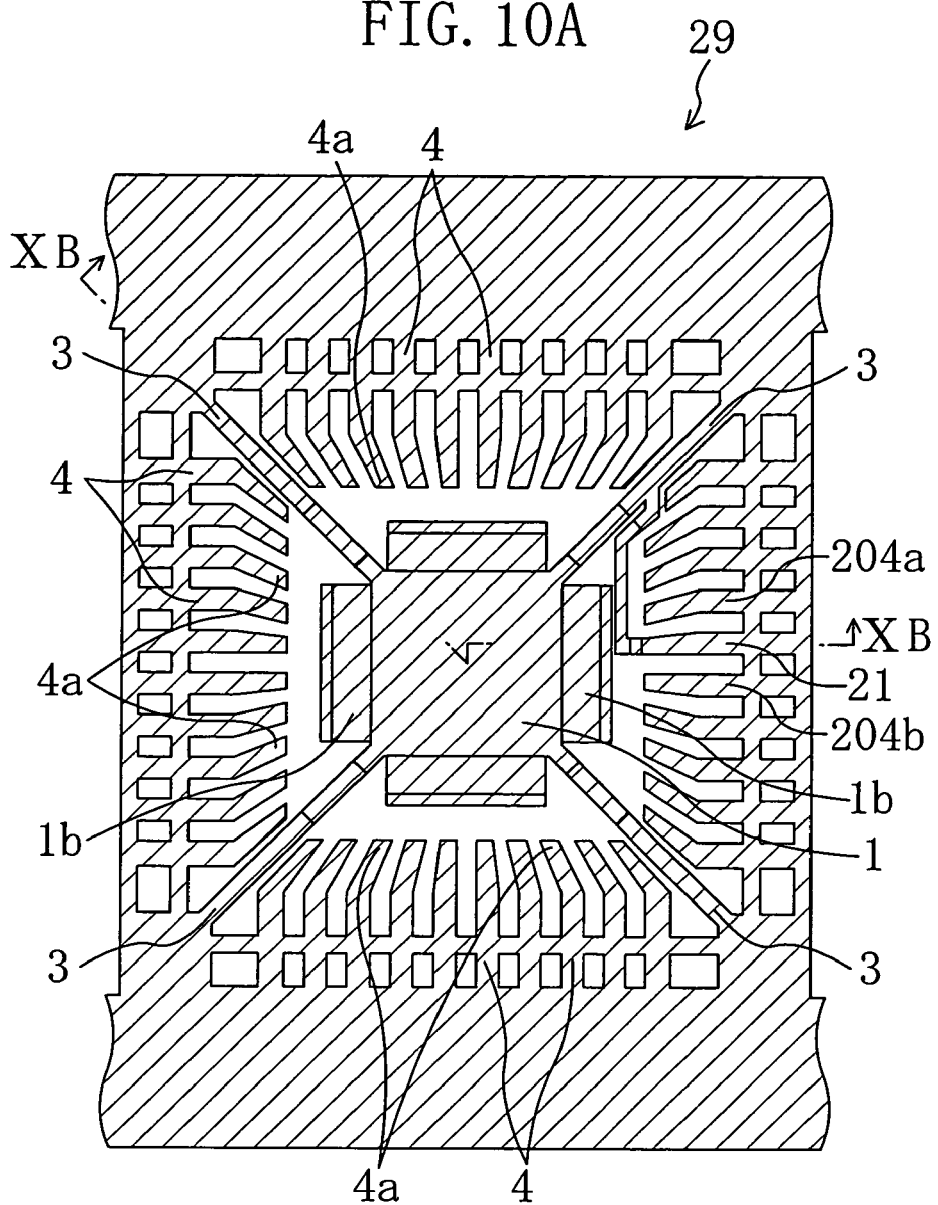
FIGS. 10A and 10B are a plan view and a cross-sectional view, respectively, for explaining a first process step for fabricating a semiconductor device 200 of a second embodiment.
Figure 10B:
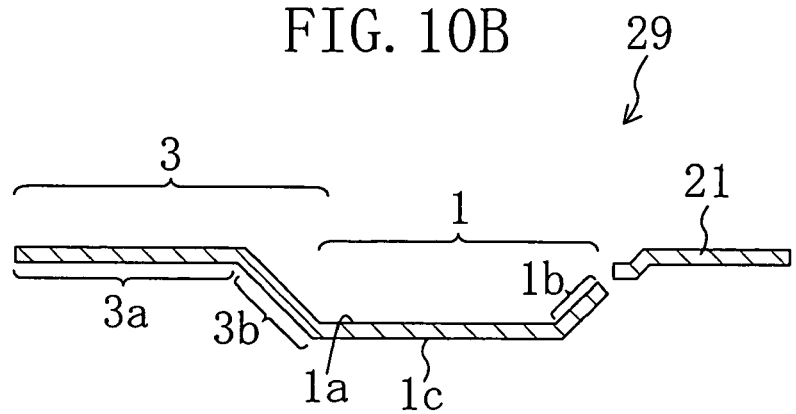
Figure 11A:
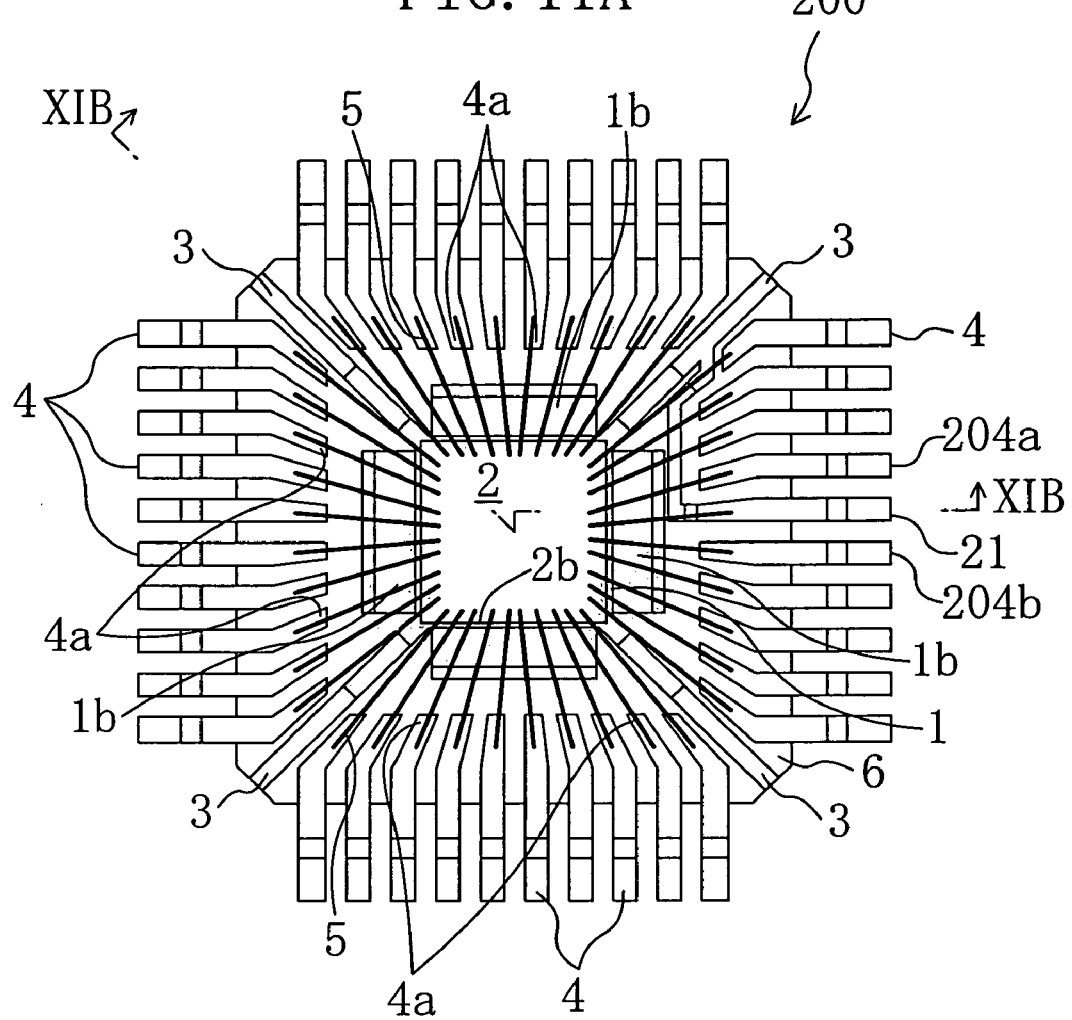
FIGS. 11A and 11B are a plan view and a cross-sectional view, respectively, for explaining a second process step for fabricating the semiconductor device 200 of the second embodiment.
Figure 11B:
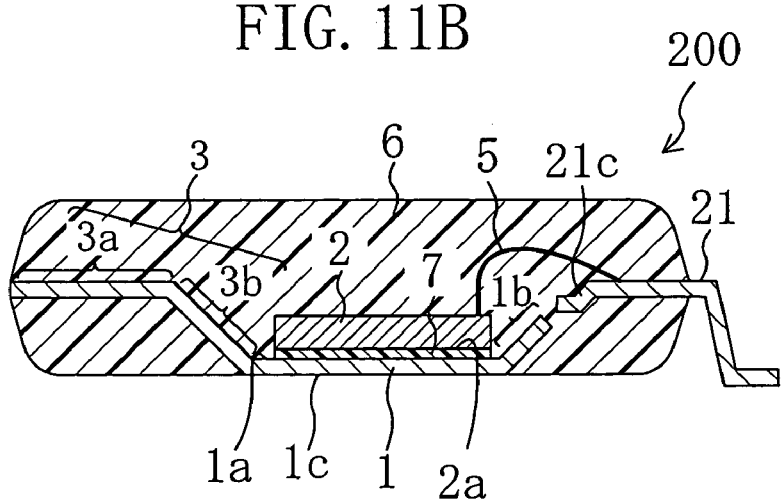

A conductive plate material is first prepared. The conductive plate material is subjected to an etching process and a pressing process, thereby integrally forming a die pad 1 on which a quadrilateral semiconductor element 2 is to be mounted, a plurality of suspension members 3, 3, ... formed continuously with the die pad 1 and extending outward from the die pad 1, a plurality of leads 4, 4, . . . provided between adjacent two of the suspension members 3 and each having a lead end 4a opposed to a corresponding edge of the semiconductor element, and a grounding lead 21 extending from one of the suspension members 3. The grounding lead 21 comprises step-like parts 21c and 21c, a lower-level grounding lead extension part 21a' located in a plane different from that of each suspension member 3 by the presence of the step-like parts, and a grounding lead parallel part 21b located between a lead 204a and another lead 204b. In this way, a lead frame 29 is fabricated as shown in FIGS. 10A and 10B. Hatching in FIG. 10A shows not a cross section but a part of the conductive plate material left without being etched in an etching process.

When the grounding lead 21 different from the grounding lead 11 of the first embodiment is to be formed, the step-like parts 21c and 21c are formed by a pressing process. To be specific, as shown in FIG. 12, the top surface 21h of the grounding lead parallel part 21b parallel to the semiconductor element mounting surface 1a is formed in substantially the same plane as the lead end top surface 4b of each lead 4. Then, both ends of a grounding lead extension part, i.e., the end of the grounding lead extension part connected with one of the suspension members 3 and the end of the grounding lead extension part connected with the grounding lead parallel part 21b, are pressed. In this way, a lower-level grounding lead extension part 21a' is formed to have both ends constituting step-like parts 21c and 21c. The top surface 21g' of the lower-level grounding lead extension part 21a' parallel to the semiconductor element mounting surface 1a is formed between the top surface 21h of the grounding lead parallel part 21b and the semiconductor element mounting surface 1a (the top surface 21g' and the top surface 21h are diagonally shaded in the opposite directions to each other in FIG. 12). In view of the above, when the lead frame 29 is seen from side, the die pad 1 is located at the lowest level, the lower-level grounding lead extension part 21a' of the grounding lead 21 is located above the semiconductor element mounting surface 1a of the die pad 1, and the grounding lead parallel part 21b of the grounding lead 21 and the leads 4 are located above the top surface 21g' of the lower-level grounding lead extension part 21a' of the grounding lead 21.

Later process steps of a method for fabricating the semiconductor device 200 are the same as those of the method for fabricating the semiconductor device 100 of the first embodiment. After the process steps, the semiconductor device 200 shown in FIGS. 11A and 11B can be fabricated. The following effect is obtained by the semiconductor device 200 of this embodiment in addition to the effects obtained by the semiconductor device 100 of the first embodiment. Since the grounding lead 21 comprises the lower-level grounding lead extension part 21a', this prevents a grounding lead extension part from spatially interfering with connecting the semiconductor element 2 through a thin conductive wire 5 to the grounding lead 21 and thus the semiconductor element 2 and the grounding lead 21 can easily be connected to each other.

Like the first embodiment, Modifications 1 through 3 of the first embodiment can be applied also to this embodiment. For example, a modification of this embodiment corresponding to Modification 1 of the first embodiment will be described hereinafter.

Figure 13A:
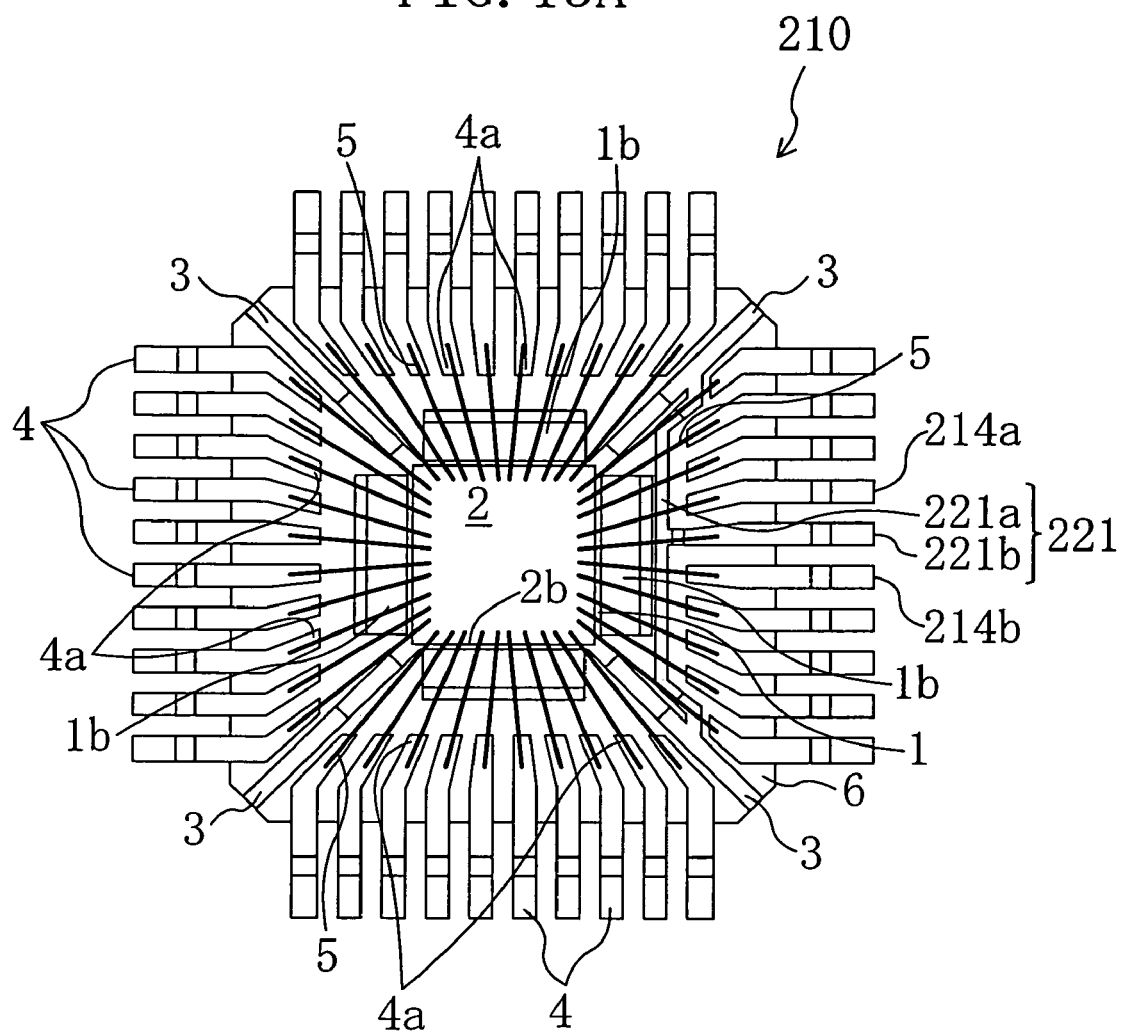
FIG. 13 is a plan view showing a semiconductor device 210 according to Modification 1 of the second embodiment.

As shown in FIG. 13, a grounding lead 221 of Modification 1 of this embodiment is generally T-shaped. A semiconductor device 210 of Modification 1 of this embodiment is the same as the semiconductor device 200 of this embodiment in the other points.

More specifically, when the grounding lead 221 is to be formed, a lower-level grounding lead extension part 221a extending from adjacent two of suspension members 3 is located between lead ends 4a opposed to a semiconductor element 2 and a die pad 1. A grounding lead parallel part 221b is formed to extend from some midpoint of the lower-level grounding lead extension part 221a and located between a lead 214a and another lead 214b. A method for fabricating the semiconductor device 210, the structure thereof, and the mechanism thereof for grounding the to-be-mounted surface of the semiconductor element are the same as those of the semiconductor device 200 of this embodiment in the other points.

The following effect is obtained by Modification 1 of this embodiment in addition to the above effects obtained by this embodiment. Since the lower-level grounding lead extension part 221a is fixed by adjacent two of the suspension members 3, this can further prevent the grounding lead 221 from being displaced.

Embodiment 3

Figure 16:
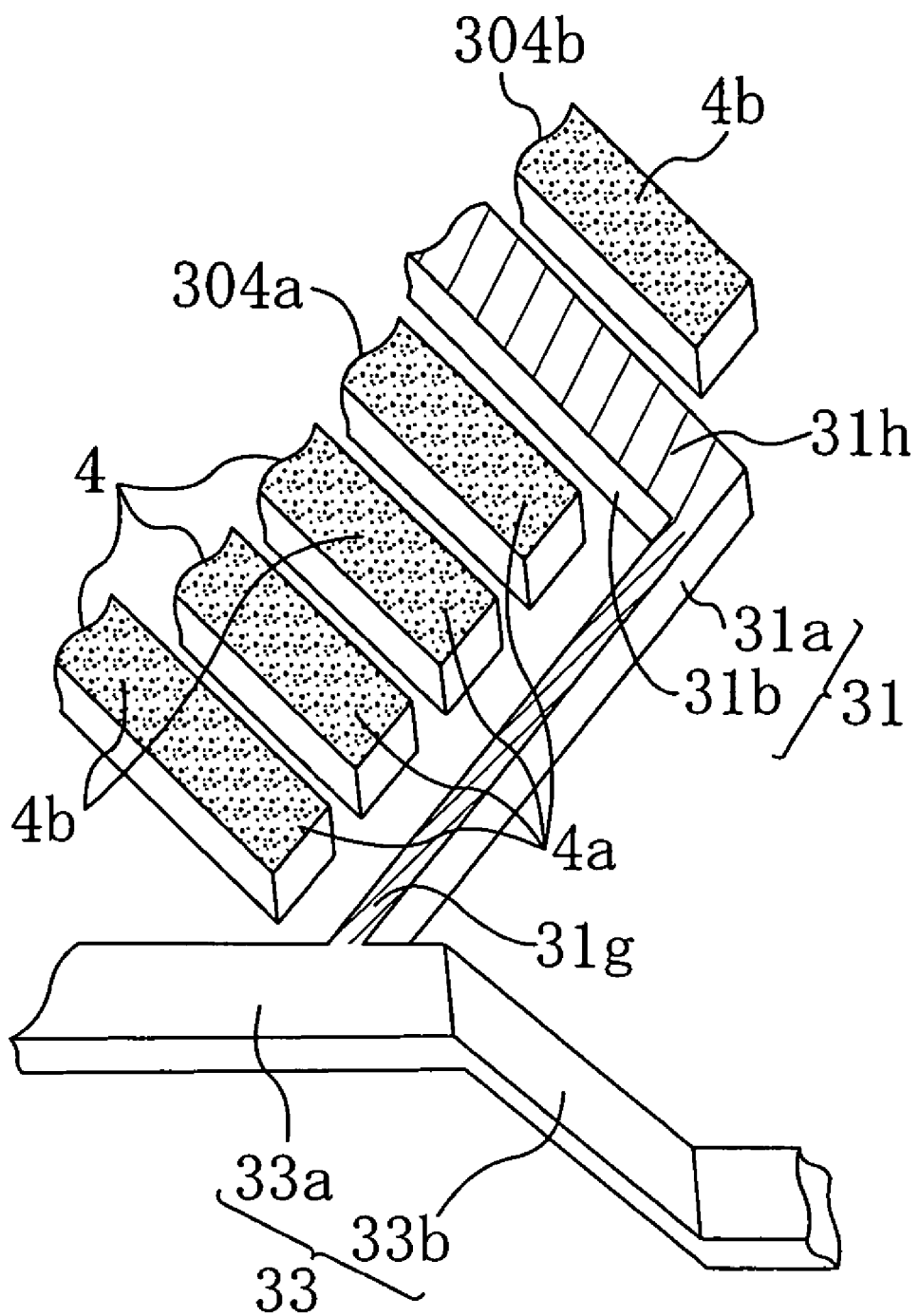
FIG. 16 is an enlarged view for explaining the first process step for fabricating the semiconductor device 300 of the third embodiment.

A semiconductor device of this embodiment will be described hereinafter with reference to FIGS. 14A through 16. It is different from the semiconductor device 100 of the first embodiment in the shapes of a grounding lead and suspension members. The same components of the semiconductor device of this embodiment as those of the first embodiment will not be described in detail. FIGS. 14A through 15B are diagrams for explaining a method for fabricating a semiconductor device 300, and FIG. 16 is a perspective view showing a grounding lead 31. The same numerals are given to components having the same structures and functions as those of the components shown in FIGS. 1A through 6 of the first embodiment.

Figure 14A:
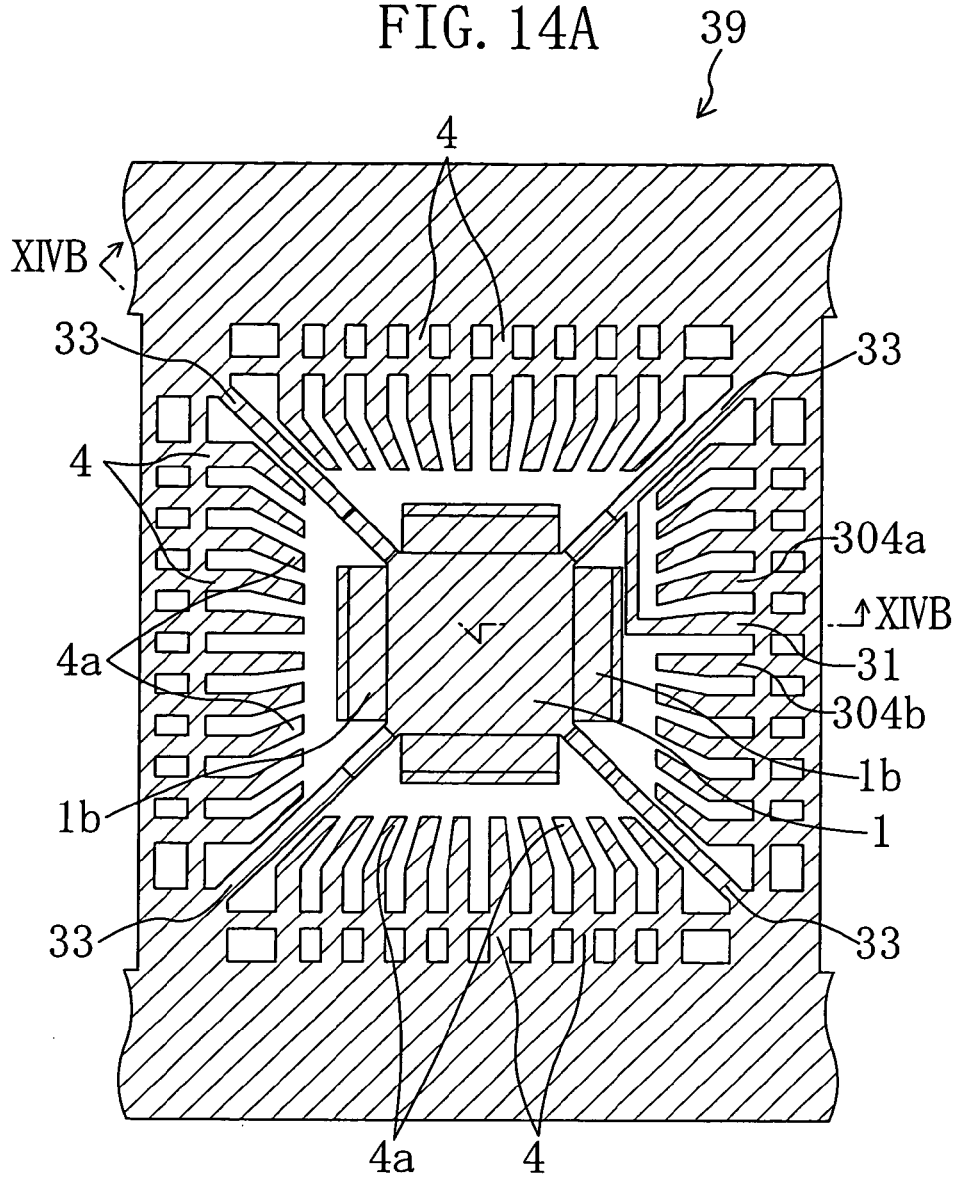
FIGS. 14A and 14B are a plan view and a cross-sectional view, respectively, for explaining a first process step for fabricating a semiconductor device 300 of a third embodiment.
Figure 14B:
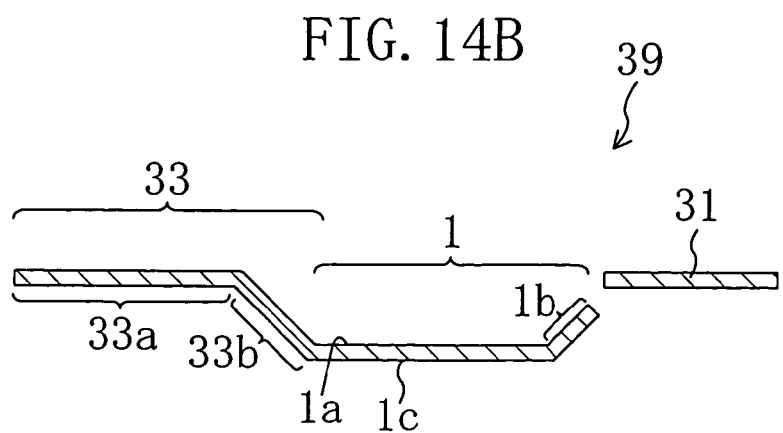
Figure 15A:
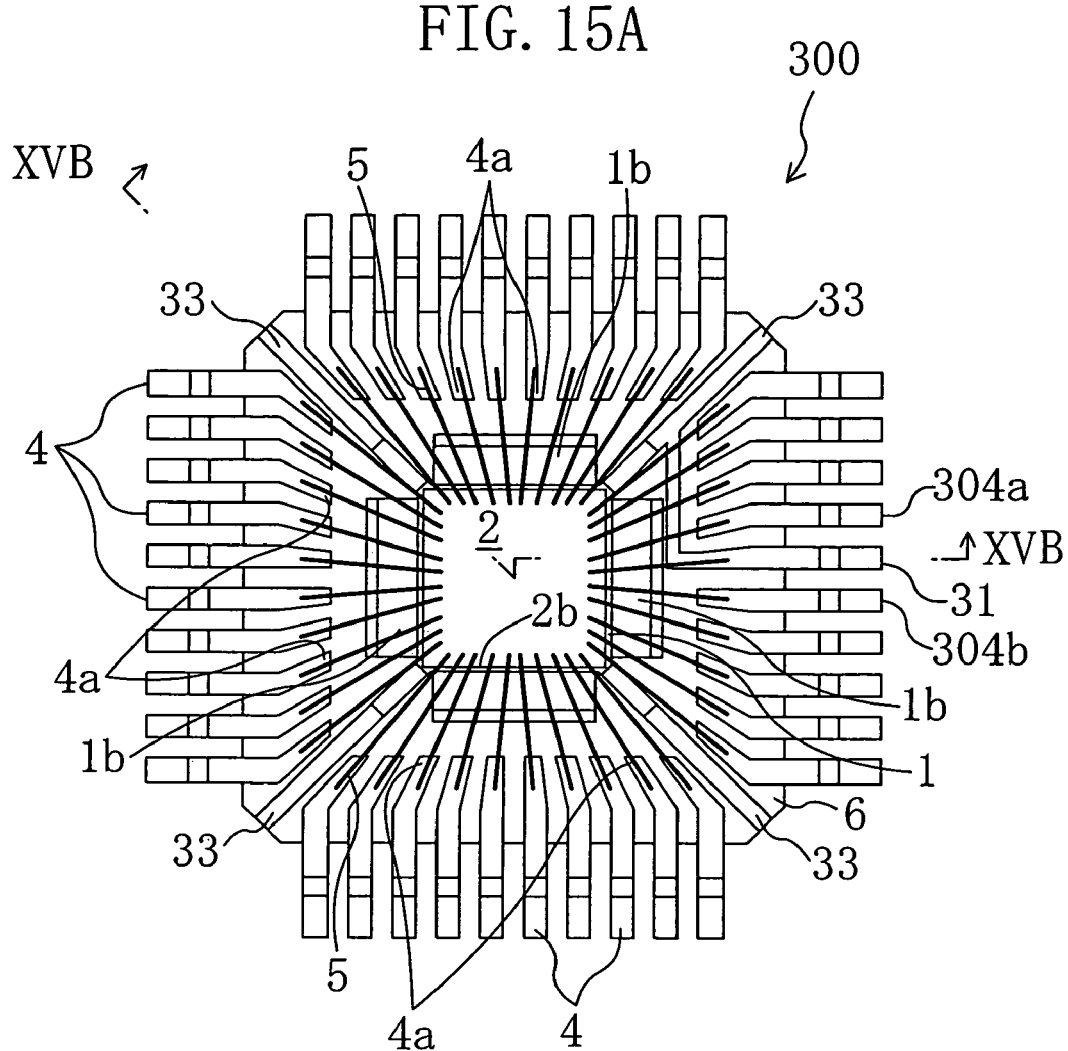
FIGS. 15A and 15B are a plan view and a cross-sectional view, respectively, for explaining a second process step for fabricating the semiconductor device 300 of the third embodiment.
Figure 15B:
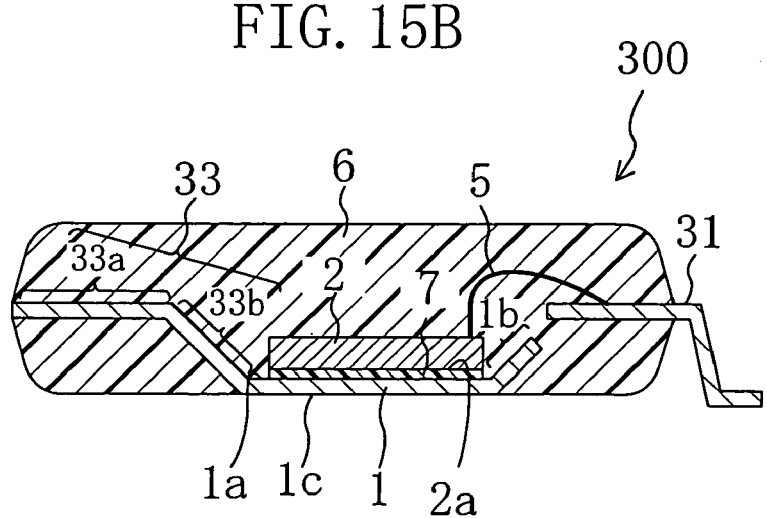

A conductive plate material is first prepared. The conductive plate material is subjected to an etching process and a pressing process, thereby integrally forming a die pad 1 on which a quadrilateral semiconductor element 2 is to be mounted, a plurality of suspension members 33, 33, . . . formed continuously with the die pad 1 and extending outward from the die pad 1, a plurality of leads 4, 4, . . . provided between adjacent two of the suspension members 33 and each having a lead end 4a opposed to a corresponding edge of the semiconductor element, and a grounding lead 31 comprising a grounding lead extension part 31a extending from one of respective flat parts 33a of the suspension members 33 and a grounding lead parallel part 31b located between a lead 304a and another lead 304b. In this way, a lead frame 39 is fabricated as shown in FIGS. 14A and 14B. Hatching in FIG. 14A shows not a cross section but a part of the conductive plate material left without being etched in an etching process.

When the suspension members 33 are to be formed, the respective flat parts 33a and respective slope parts 33b of the suspension members 33 are formed by a depressing process as shown in FIG. 14B. At this time, the contact between the grounding lead extension part 31a and one of the suspension members 33 is formed on the corresponding flat part 33a. Therefore, each slope part 33b is formed closer to the die pad 1 than each flat part 3a of the first embodiment. More particularly, each flat part 33a of this embodiment is formed closer to the die pad 1 and longer than each flat part 3a of the first embodiment, and the contact between the grounding lead extension part 31a and one of the suspension members 3 of this embodiment is also formed closer to the die pad 1 than the contact between the grounding lead extension part 11a and one of the suspension members 3 of the first embodiment.

As seen from the above, as shown in FIG. 16, the semiconductor element mounting surface 1a is formed below the flat parts 33a, and the top surface of the flat part 33a parallel to the semiconductor element mounting surface 1a, the respective lead end top surfaces 4b of the leads 4, the top surface 31g of the grounding lead extension part 31a, and the top surface 31h of the grounding lead parallel part 31b are formed in substantially the same plane.

Later process steps of a method for fabricating the semiconductor device 300 are the same as those of the method for fabricating the semiconductor device 100 of the first embodiment. After the process steps, the semiconductor device 300 shown in FIGS. 15A and 15B can be fabricated. The following effect is obtained by the semiconductor device 300 of this embodiment in addition to the effects obtained by the semiconductor device 100 of the first embodiment. The grounding lead extension part 31a need not have a bent part around the junction between the grounding lead extension part 31a and one of the suspension members 33. In other words, there is no need to provide a bent part for connecting the end of the grounding lead extension part 31a with the flat part 3a of the suspension member 3 as shown in FIG. 6. Thus, a space can effectively be utilized around the junction between the grounding lead extension part 31a and one of the suspension members 33. For example, as shown in FIG. 16, the lead ends 4a opposed to the semiconductor element can be aligned.

Like the first embodiment, Modifications 1 through 3 of the first embodiment can be applied also to this embodiment. For example, a modification of this embodiment corresponding to the first modification of the first embodiment will be described hereinafter.

Figure 17:
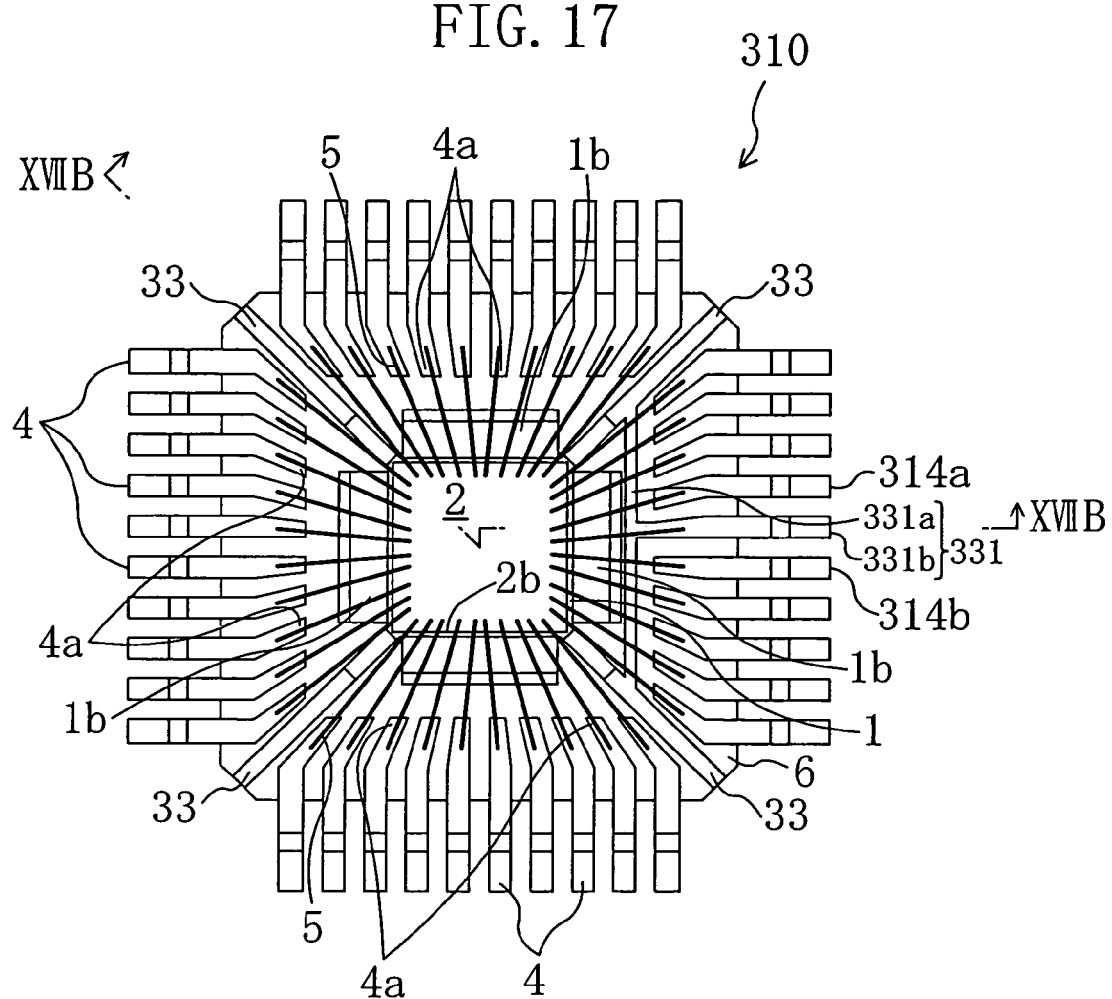
FIG. 17 is a plan view showing a semiconductor device 310 according to Modification 1 of the third embodiment.

As shown in FIG. 17, a grounding lead 331 of Modification 1 of this embodiment is generally T-shaped. A semiconductor device 310 of Modification 1 of this embodiment is the same as the semiconductor device 300 of this embodiment in the other points.

More specifically, when the grounding lead 331 is to be formed, a grounding lead extension part 331a extending from adjacent two of suspension members 33 is located between lead ends 4a opposed to a semiconductor element 2 and a die pad 1. A grounding lead parallel part 331b is formed to extend from some midpoint of the grounding lead extension part 331a and located between a lead 314a and another lead 314b. A method for fabricating the semiconductor device 310, the structure thereof, and the mechanism thereof for grounding the to-be-mounted surface of the semiconductor element are the same as those of the semiconductor device 300 of this embodiment in the other points.

The following effect is obtained by the first modification of this embodiment in addition to the above effects obtained by this embodiment. Since the grounding lead extension part 331a is fixed by adjacent two of the suspension members 3, this can further prevent the grounding lead 331 from being displaced.

Embodiment 4

Figure 20:
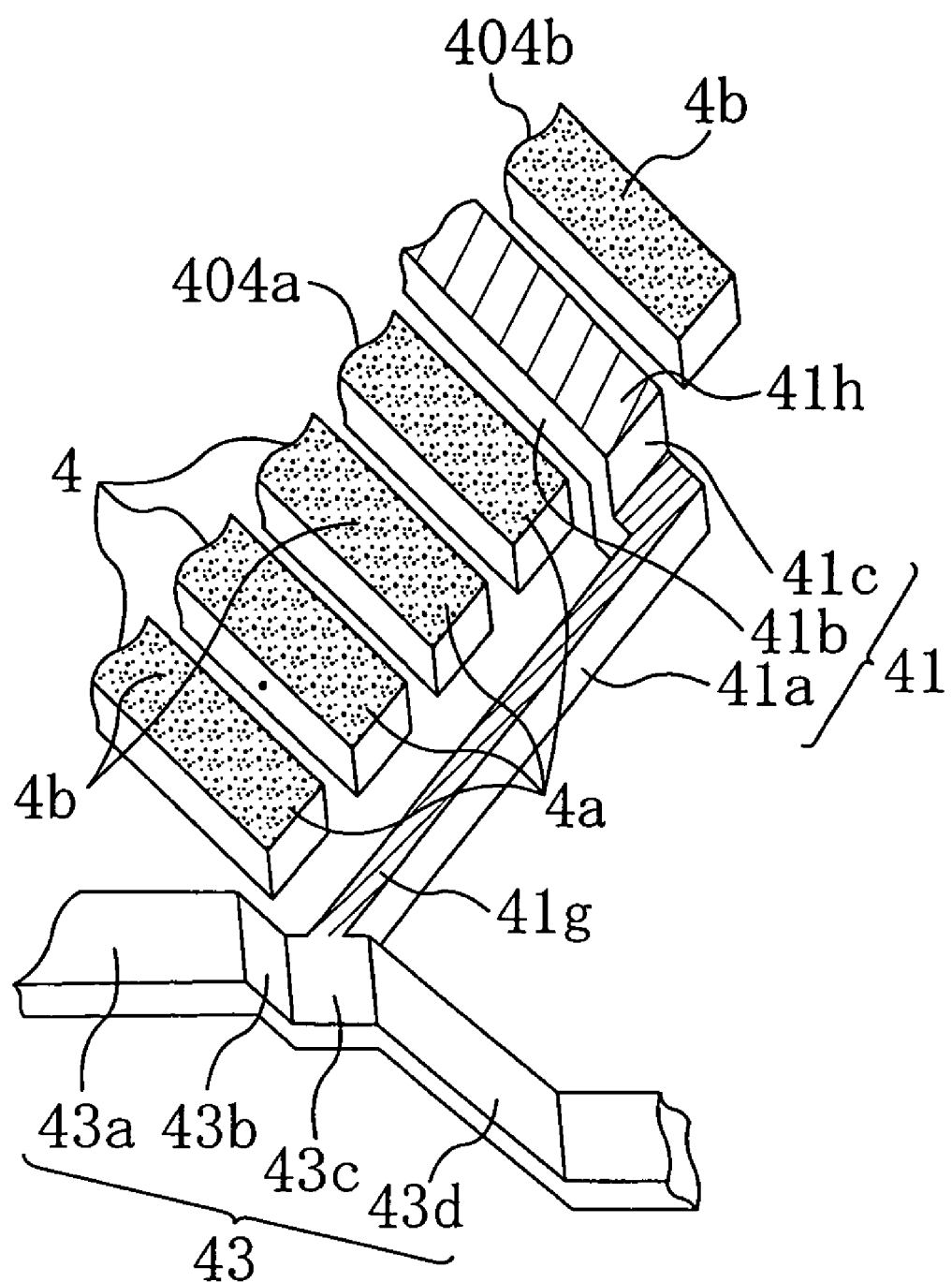
FIG. 20 is an enlarged view for explaining the first process step for fabricating the semiconductor device 400 of the fourth embodiment.

A semiconductor device of this embodiment will be described hereinafter with reference to FIGS. 18A through 20. It is different from the semiconductor device 100 of the first embodiment in the shapes of a grounding lead and suspension members. The same components of the semiconductor device of this embodiment as those of the first embodiment will not be described in detail. FIGS. 18A through 19B are diagrams for explaining a method for fabricating a semiconductor device 400, and FIG. 20 is a perspective view showing a grounding lead 41. The same numerals are given to components having the same structures and functions as those of the components shown in FIGS. 1A through 6 of the first embodiment.

Figure 18A:
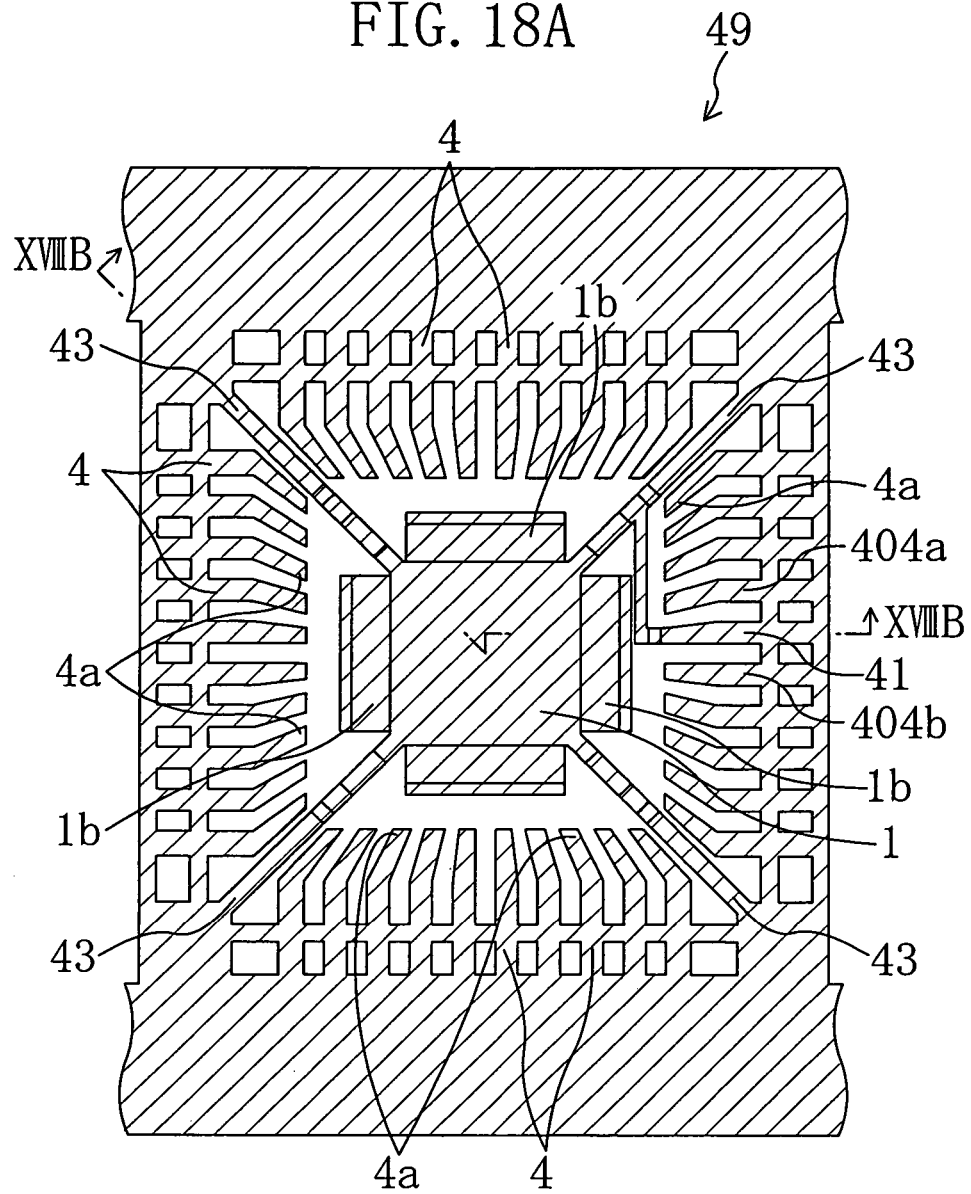
FIGS. 18A and 18B are a plan view and a cross-sectional view, respectively, for explaining a first process step for fabricating a semiconductor device 400 of a fourth embodiment.
Figure 18B:
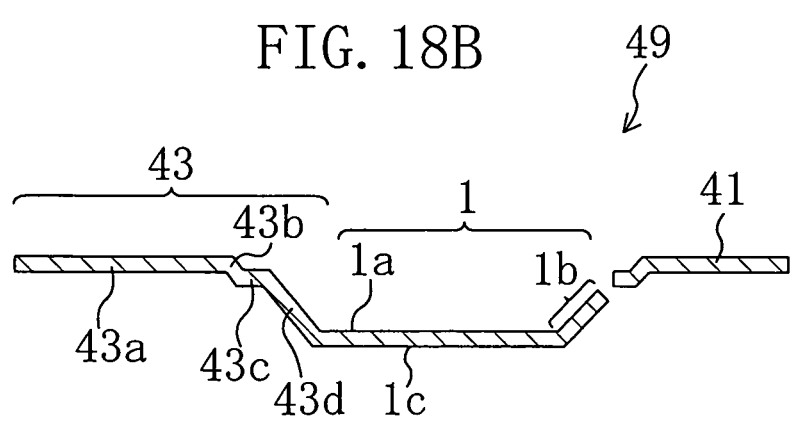
Figure 19A:
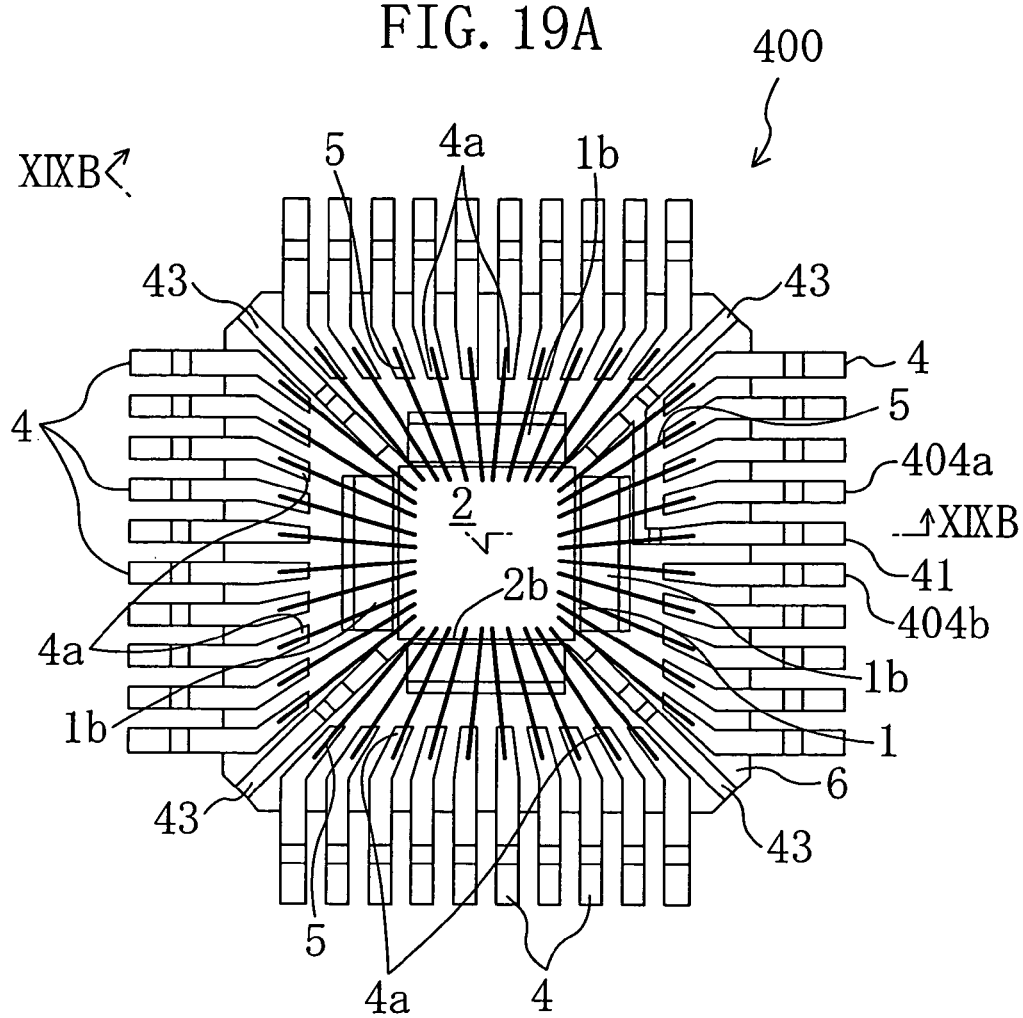
FIGS. 19A and 19B are a plan view and a cross-sectional view, respectively, for explaining a second process step for fabricating the semiconductor device 400 of the fourth embodiment.
Figure 19B:
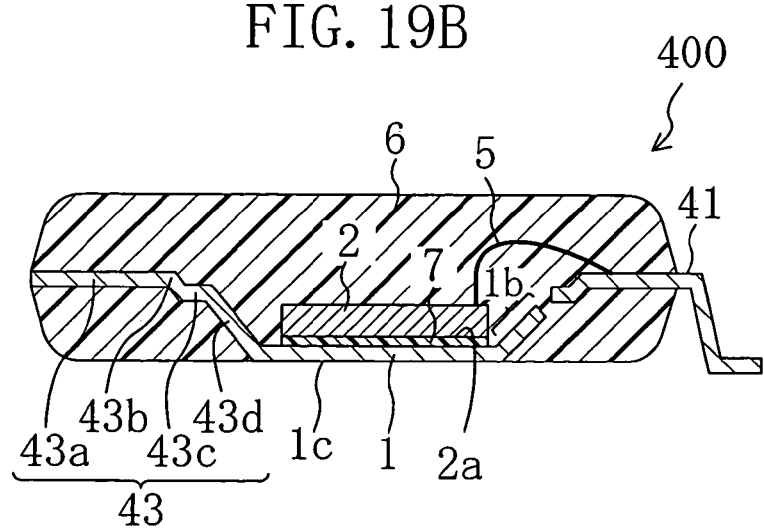

A conductive plate material is first prepared. The conductive plate material is subjected to an etching process and a pressing process, thereby integrally forming a die pad 1 on which a quadrilateral semiconductor element 2 is to be mounted, a plurality of suspension members 43, 43, ... extending outward from the die pad 1 and each comprising first and second flat parts 43a and 43c and first and second slope parts 43b and 43d, a plurality of leads 4, 4, ... provided between adjacent two of the suspension members 43 and each having a lead end 4a opposed to a corresponding edge of the semiconductor element, and a grounding lead 41 comprising a lower-level grounding lead extension part 41a extending from the second flat part 43c of one of the suspension members 43, a grounding lead parallel part 41b located between a lead 404a and another lead 404b, and a step-like part 41c through which the lower-level grounding lead extension part 41a is formed integrally with the grounding lead parallel part 41b. In this way, a lead frame 49 is fabricated as shown in FIGS. 18A and 18B. Hatching in FIG. 18A shows not a cross section but a part of the conductive plate material left without being etched in an etching process.

When the suspension members 43 are to be formed, each first slope part 43b is formed to extend so that it approaches the die pad 1 from the corresponding first flat part 43a, and each second flat part 43d is formed to extend so that it approaches the die pad 1 from the corresponding second flat part 43c. At this time, the top surface of each second flat part 43c is located in substantially the same plane as the top surface 41g of the lower-level grounding lead extension part 41a. Then, when the grounding lead 41 is to be formed, the end of a grounding lead extension part formed continuously with the grounding lead parallel part 41b is pressed, thereby locating a part of the grounding lead extension part that will be the lower-level grounding lead extension part 41a in substantially the same plane as the second flat parts 43c. In this way, the step-like part 41c is formed, and the lower-level grounding lead extension part 41a is formed to have the step-like part 43c of one of the suspension members 43 as one end. In view of the above, when the lead frame 49 is seen from side, the die pad 1 is located at the lowest level, the lower-level grounding lead extension part 41a of the grounding lead 41 and the second flat part 43c of one of the suspension members 43 are located above the semiconductor element mounting surface 1a of the die pad 1, and the grounding lead parallel part 41b of the grounding lead 41 and the first flat part 43a of one of the suspension members 43 are located above the top surface 41g of the lower-level grounding lead extension part 41a of the grounding lead 41 and the top surface of the second flat part 43c of one of the suspension members 43.

Later process steps of a method for fabricating the semiconductor device 400 are the same as those of the method for fabricating the semiconductor device 100 of the first embodiment. After the process steps, the semiconductor device 400 shown in FIGS. 19A and 19B can be fabricated. The semiconductor device 400 of this embodiment provides both the effect obtained by the semiconductor device 200 of the second embodiment and the effect obtained by the semiconductor device 300 of the third embodiment.

Like the first embodiment, Modifications 1 through 3 of the first embodiment can be applied also to this embodiment. For example, a modification of this embodiment corresponding to the first modification of the first embodiment will be described hereinafter.

Figure 21:
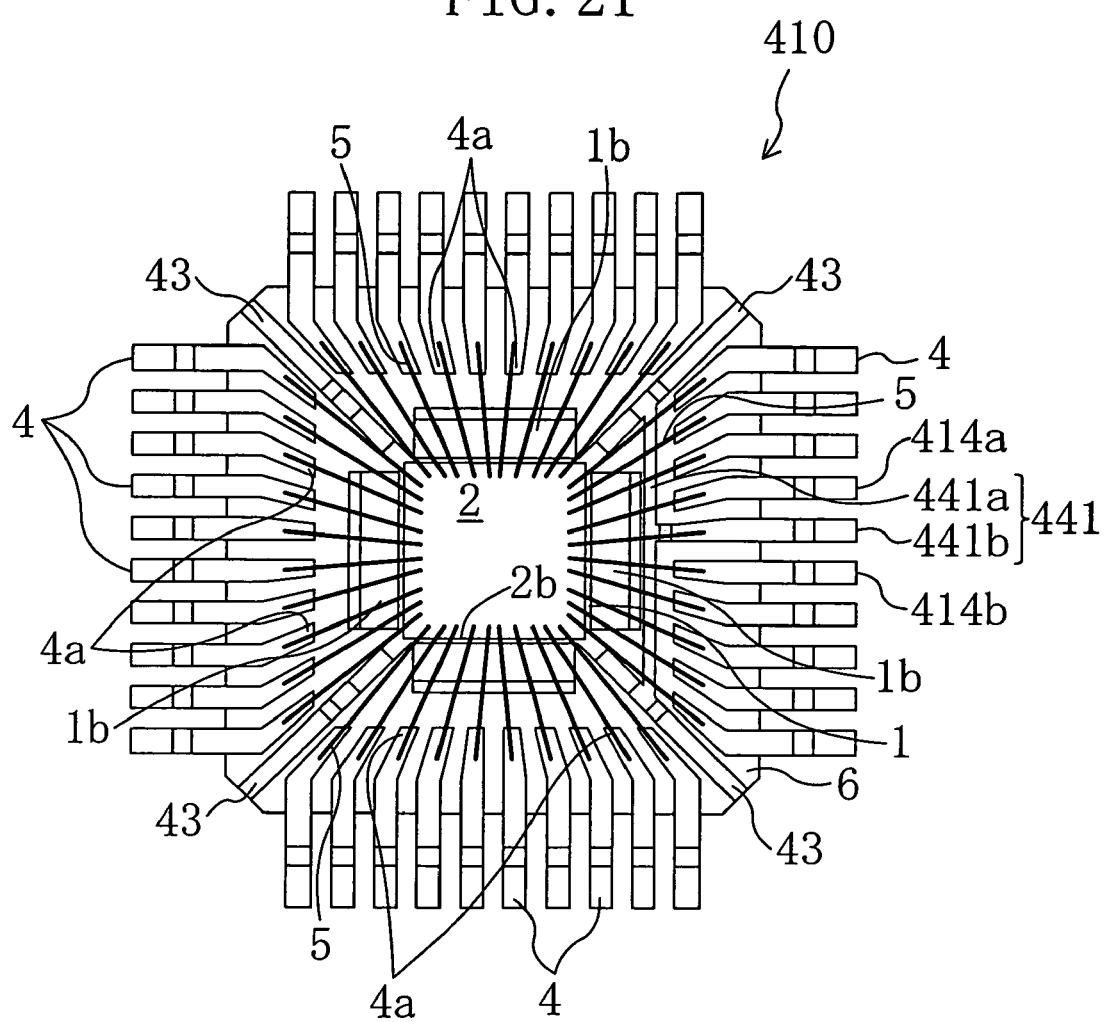
FIG. 21 is a plan view showing a semiconductor device 410 according to Modification 1 of the fourth embodiment.
Figure 24:
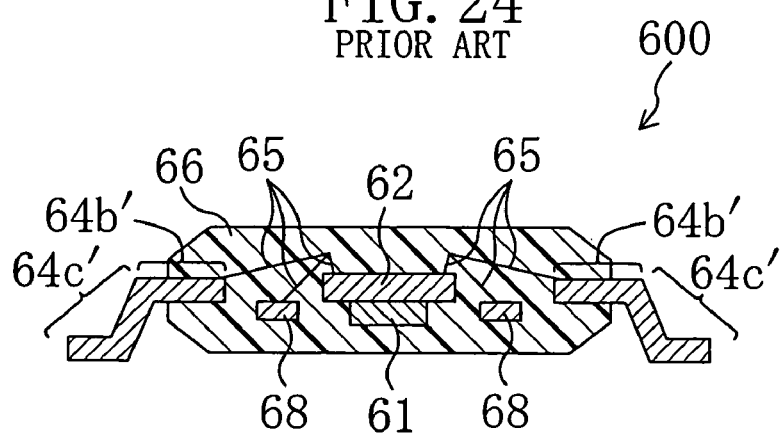
FIG. 24 is a cross-sectional view showing a semiconductor device 600 of another known example.
Figure 25:
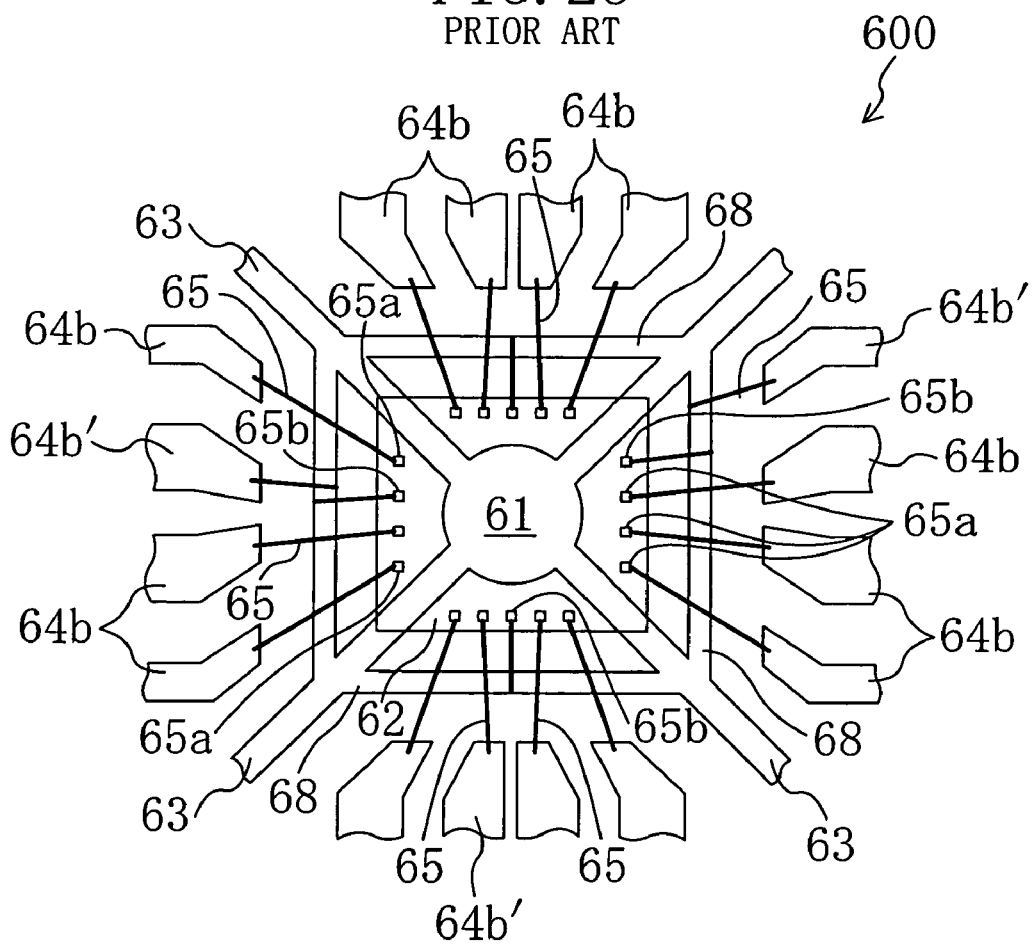
FIG. 25 is a plan view showing the semiconductor device 600 of another known example.

As shown in FIG. 21, a grounding lead 441 of Modification 1 of this embodiment is generally T-shaped. A semiconductor device 410 of Modification 1 of this embodiment is the same as the semiconductor device 400 of this embodiment in the other points.

More specifically, when the grounding lead 441 is to be formed, a lower-level grounding lead extension part 441a extending from adjacent two of suspension members 43 is located between lead ends 4a opposed to a semiconductor element 2 and a die pad 1. A grounding lead parallel part 441b is formed to extend from some midpoint of the lower-level grounding lead extension part 441a and located between a lead 414a and another lead 414b. A method for fabricating the semiconductor device 400, the structure thereof, and the mechanism thereof for grounding the to-be-mounted surface of the semiconductor element are the same as those of the semiconductor device 400 of this embodiment in the other points.

The following effect is obtained by Modification 1 of this embodiment in addition to the above effects obtained by this embodiment. Since the lower-level grounding lead extension part 441a is fixed by adjacent two of the suspension members 43, this can further prevent the grounding lead 441 from being displaced.

What is claimed is:

1. A semiconductor device comprising a die pad of a conductive material, a quadrilateral semiconductor element mounted on the die pad, a plurality of suspension members of the conductive material formed continuously with the die pad and extending outward from the die pad, a plurality of leads of the conductive material provided between adjacent two of the suspension members and each having one end opposed to a corresponding edge of the semiconductor element, a plurality of thin conductive wires through which the corresponding leads are connected to the semiconductor element; and an encapsulant for encapsulating the die pad, the semiconductor element, the suspension members, parts of the leads and the thin conductive wires, the other end of said each lead opposite to said one end thereof protruding from the encapsulant to the outside, wherein the semiconductor device further comprises a grounding lead formed of the conductive material, branching from at least one of the suspension members and aligned, in part, generally parallel with the leads, a grounding lead parallel part of the grounding lead aligned generally parallel with the leads is located between one and another of the leads without any of the suspension member therebetween and is formed in the same plane as the leads, the suspension members comprise flat parts extending in a generally parallel direction with the die pad and formed above the die pad and slope parts connecting the flat parts with the die pad, one of the slope parts is located between a portion of the grounding lead, wherein the said portion is branched from the suspension member but excludes the grounding lead parallel part and the die pad, and one of the leads adjacent to one of the suspension members is shorter than all the other leads.

2. The semiconductor device of claim 1, wherein
the die pad and the semiconductor element are electrically connected to each other at a semiconductor element mounting surface of the die pad on which the semiconductor element is mounted.

3. The semiconductor device of claim 1, wherein
the semiconductor element mounting surface, the top surface of the grounding lead parallel part, and the top surface of a part of the grounding lead other than the grounding lead parallel part are generally parallel to one another, and the top surface of the part of the grounding lead other than the grounding lead parallel part is provided between the semiconductor element mounting surface and the top surface of the grounding lead parallel part.

4. The semiconductor device of claim 1, wherein
the part of the grounding lead other than the grounding lead parallel part comprises a step-like part approaching the semiconductor element mounting surface from the grounding lead parallel part.

5. The semiconductor device of claim 1, wherein
the part of the grounding lead other than the grounding lead parallel part is located between the semiconductor element and the ends of some of the leads opposed to the corresponding edge of the semiconductor element.

6. The semiconductor device of claim 1, wherein
at least one of the thin conductive wires is provided across the part of the grounding lead other than the grounding lead parallel part.

7. The semiconductor device of claim 1, wherein
the ends of the plurality of leads opposed to the corresponding edges of the semiconductor element, and the surfaces thereof generally parallel to the semiconductor element mounting surface, are in substantially the same plane, which is different from the plane of semiconductor element mounting surface.

8. The semiconductor device of claim 1, wherein
the surface of the die pad opposite to the semiconductor element mounting surface is exposed from the encapsulant.

9. The semiconductor device of claim 1, wherein
the die pad comprises at least one extension extending outward from a region of the die pad on which the semiconductor element is mounted, and
at least one part of the extension is bent toward the leads from the region of the die pad on which the semiconductor element is mounted.

10. The semiconductor device of claim 1, wherein
the surface of the die pad opposite to the semiconductor element mounting surface comprises an indentation around its periphery.

11. The semiconductor device of claim 1, wherein
the leads are located in both sides of the grounding lead parallel part and in the vicinity of the grounding lead parallel part.

12. The semiconductor device of claim 1, wherein
one end of the one of the leads adjacent to one of the suspension members which is shorter than the other leads is located further away from the die pad than the end of the other leads, and
a part of the grounding lead passes through a gap created by positioning the one end of the one of the leads adjacent to one of the suspension members further away from the die pad than the ends of the other leads.

13. A method for fabricating a semiconductor device, said method comprising the steps of:
processing a conductive plate material to integrally form a die pad on which a quadrilateral semiconductor element is to be mounted, a plurality of suspension members formed continuously with the die pad and extending outward from the die pad, a plurality of leads provided between adjacent two of the suspension members and each having one end opposed to a corresponding edge of the semiconductor element, and a grounding lead extending from at least one of the suspension members and aligned, in part, generally parallel with the leads;

mounting the semiconductor element on the die pad;

connecting the semiconductor element through thin conductive wires to the leads, respectively; and encapsulating the die pad, the semiconductor element, the suspension members, parts of the leads, the grounding lead, and the thin conductive wires using an encapsulant, wherein a grounding lead parallel part of the grounding lead aligned generally parallel with the leads is located between one and another of the leads without any of the suspension member therebetween and is formed in the same plane as the leads, the suspension members comprise flat parts extending in a generally parallel direction with the die pad and formed above the die pad and slope parts connecting the flat parts with the die pad, one of the slope parts is located between a portion of the grounding lead, wherein the said portion is branched from the suspension member but excludes the grounding lead parallel part and the die pad, and one of the leads adjacent to one of the suspension members is shorter than all the other leads.

14. The method of claim 13, wherein
in the step of mounting the semiconductor element on the die pad, the die pad is electrically connected to the semiconductor element at a semiconductor element mounting surface of the die pad on which the semiconductor element is mounted.

15. The method of claim 13, wherein
in the step of processing the conductive plate material, a semiconductor element mounting surface of the die pad on which the semiconductor element is mounted, the top surface of the grounding lead parallel part, and the top surface of a part of the grounding lead other than the grounding lead parallel part are provided generally parallel to one another, and the top surface of the part of the grounding lead other than the grounding lead parallel part is provided between the semiconductor element mounting surface and the top surface of the grounding lead parallel part.

16. The method of claim 13, wherein
in the step of processing the conductive plate material, the part of the grounding lead other than the grounding lead parallel part is provided with a step-like part approaching the semiconductor element mounting surface from the grounding lead parallel part.

17. The method of claim 13, wherein
in the step of processing the conductive plate material, the part of the grounding lead other than the grounding lead parallel part is located between the semiconductor element and the ends of some of the leads opposed to the corresponding edge of the semiconductor element.

18. The method of claim 13, wherein
in the step of connecting the semiconductor element through thin conductive wires to the leads, respectively, at least one of the thin conductive wires is provided across the part of the grounding lead other than the grounding lead parallel part.

19. The method of claim 13, wherein
in the step of processing the conductive plate material, parts of the conductive plate material that will be the ends of the plurality of leads opposed to the corresponding edges of the semiconductor element, and the surfaces thereof generally parallel to the semiconductor element mounting surface, are formed to be in substantially the same plane, which is different from the plane semiconductor element mounting surface.

20. The method of claim 13, wherein
in the encapsulating step using the encapsulant, the surface of the die pad opposite to the semiconductor element mounting surface is exposed from the encapsulant.

21. The method of claim 13, wherein
in the step of processing the conductive plate material, the die pad is formed to have at least one extension extending outward from a region of the die pad on which the semiconductor element is to be mounted, and
at least one part of the extension is bent toward the leads from the region of the die pad on which the semiconductor element is mounted.

22. The method of claim 13, wherein
the step of processing the conductive plate material comprises the step of providing an indentation around the periphery of the surface of the die pad opposite to the semiconductor element mounting surface.

23. The method of claim 13, wherein
one end of the one of the leads adjacent to one of the suspension members which is shorter than the other leads is located further away from the die pad than the end of the other leads, and
a part of the grounding lead passes through a gap created by positioning the one end of the one of the leads adjacent to one of the suspension members further away from the die pad than the ends of the other leads.

* * * * *